(12) United States Patent
Sun et al.

(10) Patent No.: US 10,250,417 B1
(45) Date of Patent: Apr. 2, 2019

(54) SERIAL LINK ADAPTIVE EQUALIZATION USING TRACK AND HOLD CIRCUITS

(71) Applicant: QUALCOMM Incorporated, San Diego, CA (US)

(72) Inventors: Bo Sun, Carlsbad, CA (US); Daniel Butterfield, Encinitas, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/948,896

(22) Filed: Apr. 9, 2018

(51) Int. Cl.
   H04L 25/03    (2006.01)
   H03K 5/24    (2006.01)

(52) U.S. Cl.
   CPC ......... H04L 25/03828 (2013.01); H03K 5/24 (2013.01)

(58) Field of Classification Search
   CPC ............................ H04L 25/03828; H03K 5/24
   See application file for complete search history.

(56) References Cited

U.S. PATENT DOCUMENTS

| | | | |
|---|---|---|---|
| 5,889,663 A * | 3/1999 | Tabata | H02M 3/1584 363/56.03 |
| 7,426,235 B1 | 9/2008 | Anderson et al. | |
| 7,502,411 B2 | 3/2009 | Kim et al. | |
| 7,746,969 B2 | 6/2010 | Bryan et al. | |
| 8,111,792 B2 | 2/2012 | Ou | |
| 8,483,263 B2 | 7/2013 | Aoki | |

OTHER PUBLICATIONS

Lee M-J E., et al., "Low-Power Area-Efficient High-Speed I/O Circuit Techniques," IEEE Journal of Solid-State Circuits, Nov. 2000, vol. 35, No. 11, pp. 1591-1599.

* cited by examiner

Primary Examiner — Kabir A Timory
(74) Attorney, Agent, or Firm — Loza & Loza LLP

(57) ABSTRACT

One feature pertains to an apparatus that includes a first stage track and hold circuit that subsamples a receive equalizer output of a receive equalizer, and a second stage track and hold circuit that generates a first signal representative of an average voltage value of a logical value at the receive equalizer output when a high frequency bit pattern is detected, and a second signal representative of an average voltage value of the logical value at the receive equalizer output when a steady state bit pattern is detected. The apparatus further includes a comparator circuit that generates a comparator output signal that indicates which of the first signal and the second signal has a greater magnitude, and a processing circuit that generates equalizer tuning signals based on the comparator output signal to adjust parameters of an equalizer that affects the receive equalizer output.

30 Claims, 13 Drawing Sheets

SERIAL LINK ADAPTIVE EQUALIZATION USING TRACK AND HOLD CIRCUITS

BACKGROUND

Field

Various aspects of the present disclosure relate to equalization techniques and, more particularly, to methods and apparatuses for high-speed serial link adaptive equalization using track and hold circuits.

Background

Serial communication is the process of sending data one bit at a time, sequentially, over a communication channel or computer bus. This is in contrast to parallel communication, where several bits are sent as a whole, on a link with several parallel channels. Although serial communication may seem inferior to parallel communication since it transmits less data per clock cycle, it is often the case that serial links can be clocked considerably faster than parallel links to achieve higher data rates. Some factors that allow serial communication links to be clocked at a higher rate than parallel links include: less or no clock skew concerns; fewer interconnecting cables or wires provide space savings; and less crosstalk. Serial communication may also be cheaper to implement over parallel communication systems.

FIG. 1 illustrates a schematic block diagram of a standard serial link communication system 100 found in the prior art. A serializer 102 receives data in parallel and outputs it one bit at a time for serial transmission over a lossy channel 106 (e.g., copper wire). The channel 106 typically has a low pass frequency response that attenuates high frequency signals and a pulse response that spreads over an increasing number of unit intervals as channel length and signal bandwidth increases. To compensate for this expected frequency and pulse response of the channel, a transmission equalizer 104 pre-distorts the signal in order to invert the channel distortion. Similarly, on the receive side, a receive equalizer 108 is used to process the received signal to compensate for channel loss, provide gain, and/or cancel intersymbol interference (ISI). A deserializer 110 then converts the serial data received back into a parallel data signal.

As the data rate through the serial link communication system 100 increases, the channel's 106 high frequency loss characteristics becomes increasingly problematic and results in bit errors. Adaptive equalization may be employed at the transmit equalizer 104 and/or the receive equalizer 108 to help the system 100 attain greater throughput.

However, there is a need for improved adaptive equalization techniques that result in increased performance (e.g., greater data rates with less bit errors, reduced ISI, etc.) while maintaining or reducing the cost and complexity of systems employing such techniques.

SUMMARY

One feature provides an apparatus comprising a first stage track and hold circuit configured to subsample a receive equalizer output of a receive equalizer, a second stage track and hold circuit coupled to the first stage track and hold circuit, the second stage track and hold circuit configured to generate (a) a first signal representative of an average voltage value of a logical value at the receive equalizer output when a high frequency (HF) bit pattern is detected, and (b) a second signal representative of an average voltage value of the logical value at the receive equalizer output when a steady state bit pattern is detected, a comparator circuit configured to generate a comparator output signal that indicates which of the first signal and the second signal has a greater magnitude, and a processing circuit that generates at least one equalizer tuning signal based on the comparator output signal, the equalizer tuning signal configured to adjust one or more parameters of an equalizer that affects the receive equalizer output. According to one aspect of the disclosure, the first stage track and hold circuit comprises a first transistor coupled to a first capacitor. According to another aspect, the first transistor is a metal-oxide semiconductor field effect transistor (MOSFET) having a drain coupled to the receive equalizer output and a source coupled to a first terminal of the first capacitor, the first capacitor having a second terminal that is grounded, and the first transistor having a gate that is driven by a subsample clock having a period that is x+1 times greater than a period of data at the receive equalizer output, where x is equal to a number of bits of the high frequency bit pattern or a number of bits of the steady state bit pattern.

According to one aspect of the disclosure, the first stage track and hold circuit samples every fourth data bit at the receive equalizer output by enabling the first transistor to an ON state to electrically couple the first capacitor to the receive equalizer output. According to another aspect, the second stage track and hold circuit comprises an HF path transistor, a low frequency (LF) path transistor, an HF path capacitor, and an LF path capacitor. According to yet another aspect, the HF path and LF path transistors have drains that are coupled to the first terminal of the first capacitor, the HF path transistor having a source coupled to a first terminal of the HF path capacitor, the LF path transistor having a source coupled to a first terminal of the LF path capacitor, the HF path capacitor's first terminal providing the first signal representative of the average voltage value of the logical value at the receive equalizer output when the high frequency bit pattern is detected, and the LF path capacitor's first terminal providing the second signal representative of the average voltage value of the logical value at the receive equalizer output when the steady state bit pattern is detected.

According to one aspect of the disclosure, the apparatus further comprises an HF pattern detection circuit configured to generate an HF track-enable signal when the HF pattern detection circuit detects the HF bit pattern, the HF pattern detection circuit coupled to a gate of the HF path transistor and configured to enable the HF path transistor with the HF track-enable signal, and an LF pattern detection circuit configured to generate an LF track-enable signal when the LF pattern detection circuit detects the steady state bit pattern, the LF pattern detection circuit coupled to a gate of the LF path transistor and configured to enable the LF path transistor with the LF track-enable signal, wherein enabling the HF path transistor with the HF track-enable signal electrically couples the first terminal of the HF path capacitor to the first terminal of the first capacitor, and enabling the LF path transistor with the LF track-enable signal electrically couples the first terminal of the LF path capacitor to the first terminal of the first capacitor. According to another aspect, the first signal representative of the average voltage value of the logical value at the receive equalizer output when the HF bit pattern is detected is based on at least X number of samples of the receive equalizer output by the first stage track and hold circuit, where X=M*(Capacitance (HF path capacitor)/Capacitance(first capacitor)), and the second signal representative of the average voltage value of the logical value at the receive equalizer output when the steady state bit pattern is detected is based on at least Y number of samples of the receive equalizer output by the first stage track and hold circuit, where Y=M*(Capacitance (LF path capacitor)/Capacitance(first capacitor)), and M is equal to or greater than ten (10). According to yet another aspect, the HF bit pattern is logical values "0 0 1" and the steady state bit pattern is at least one of logical values "1 1 1" and/or "0 1 1."

According to one aspect of the disclosure, the HF bit pattern is logical values "1 1 0" and the steady state bit pattern is at least one of logical values "0 0 0" and/or "1 0 0." According to another aspect, the first signal is representative of an average voltage value of a logical value "1" at the receive equalizer output when the HF bit pattern is detected and the second signal is representative of an average voltage value of the logical value "1" at the receive equalizer output when the steady state bit pattern is detected. According to yet another aspect, the first signal is representative of an average voltage value of a logical value "0" at the receive equalizer output when the HF bit pattern is detected and the second signal is representative of an average voltage value of the logical value "0" at the receive equalizer output when the steady state bit pattern is detected.

According to one aspect of the disclosure, the first signal having a magnitude greater than the second signal indicates that the first signal is over-peaking relative to the second signal and the equalizer tuning signal adjusts the one or more parameters of the equalizer to reduce high frequency gain at the equalizer. According to another aspect, the second signal having a magnitude greater than the first signal indicates that the first signal is under-peaking relative to the second signal and the equalizer tuning signal adjusts the one or more parameters of the equalizer to boost high frequency gain at the equalizer. According to yet another aspect, the at least one equalizer tuning signal includes a receive equalizer tuning signal that changes one or more parameters of the receive equalizer.

According to one aspect of the disclosure, the receive equalizer is an adaptive continuous time linear equalizer and the one or more parameters of the receive equalizer include at least one of a capacitance, resistance, and/or inductance of the adaptive continuous time linear equalizer. According to another aspect, the at least one equalizer tuning signal includes a transmit equalizer tuning signal that changes one or more parameters of a transmit equalizer, the transmit equalizer configured to transmit a data signal over a lossy channel received by the receive equalizer. According to yet another aspect, the transmit equalizer is a finite impulse response filter and the one or more parameters of the transmit equalizer include at least one of delay tap coefficient values, number of delay taps, and/or tap delay timing. According to yet another aspect, the first signal representative of the average voltage value of the logical value at the receive equalizer output when the HF bit pattern is detected is based on at least a few tens of samples of the receive equalizer output by the first stage track and hold circuit, and the second signal representative of the average voltage value of the logical value at the receive equalizer output when the steady state bit pattern is detected is based on at least a few tens of samples of the receive equalizer output by the first stage track and hold circuit.

According to one aspect, the second stage track and hold circuit comprises a second transistor, a second capacitor, and a memory circuit, the second transistor coupled to the second capacitor and the second capacitor coupled to the memory circuit. According to another aspect, the apparatus further comprises a pattern detection circuit that is configured to detect the HF bit pattern and turn the second transistor ON to couple the first transistor to the second transistor and allow the first signal to be generated at the second capacitor and stored at the memory circuit, the pattern detection circuit further configured to detect the steady state bit pattern and turn the second transistor ON to couple the first transistor to the second transistor and allow the second signal to be generated at the second capacitor and stored at the memory circuit, and wherein the comparator circuit receives the first and second signals from the memory circuit to generate the comparator output signal.

Another feature provides a method comprising subsampling a receive equalizer output of a receive equalizer via a first stage track and hold circuit, generating, via a second stage track and hold circuit, a first signal representative of an average voltage value of a logical value at the receive equalizer output when a high frequency (HF) bit pattern is detected, generating, via the second stage track and hold circuit, a second signal representative of an average voltage value of the logical value at the receive equalizer output when a steady state bit pattern is detected, generating at a comparator circuit a comparator output signal that indicates which of the first signal and the second signal has a greater magnitude, generating at least one equalizer tuning signal based on the comparator output signal, and adjusting one or more parameters of an equalizer that affects the receive equalizer output using the at least one equalizer tuning signal. According to one aspect, the method further comprises detecting the HF bit pattern and turning a second transistor ON to couple a first transistor to a second transistor to allow the first signal to be generated at a second capacitor, storing a first value representative of the first signal at a memory circuit, detecting the steady state bit pattern and turning the second transistor ON to couple the first transistor to the second transistor to allow the second signal to be generated at the second capacitor, and storing a second value representative of the second signal at the memory circuit, wherein the comparator circuit receives the first and second signals from the memory circuit to generate the comparator output signal.

Another feature provides an apparatus comprising means for subsampling a receive equalizer output of a receive equalizer, means for generating a first signal representative of an average voltage value of a logical value at the receive equalizer output when a high frequency (HF) bit pattern is detected, means for generating a second signal representative of an average voltage value of the logical value at the receive equalizer output when a steady state bit pattern is detected, means for generating a comparator output signal that indicates which of the first signal and the second signal has a greater magnitude, means for generating at least one equalizer tuning signal based on the comparator output signal, and means for adjusting one or more parameters of an equalizer that affects the receive equalizer output using the at least one equalizer tuning signal.

Another feature provides a non-transitory computer-readable storage medium having instructions stored thereon, the instructions, which when executed by at least one processor, causes the at least one processor to subsample a receive equalizer output of a receive equalizer via a first stage track and hold circuit, generate, via a second stage track and hold circuit, a first signal representative of an average voltage value of a logical value at the receive equalizer output when a high frequency (HF) bit pattern is detected, generate, via the second stage track and hold circuit, a second signal representative of an average voltage value of the logical value at the receive equalizer output when a steady state bit pattern is detected, generate at a comparator circuit a comparator output signal that indicates which of the first signal and the second signal has a greater magnitude, generate at least one equalizer tuning signal based on the comparator output signal, and adjust one or more parameters of an equalizer that affects the receive equalizer output using the at least one equalizer tuning signal.

DETAILED DESCRIPTION

Figure 1:
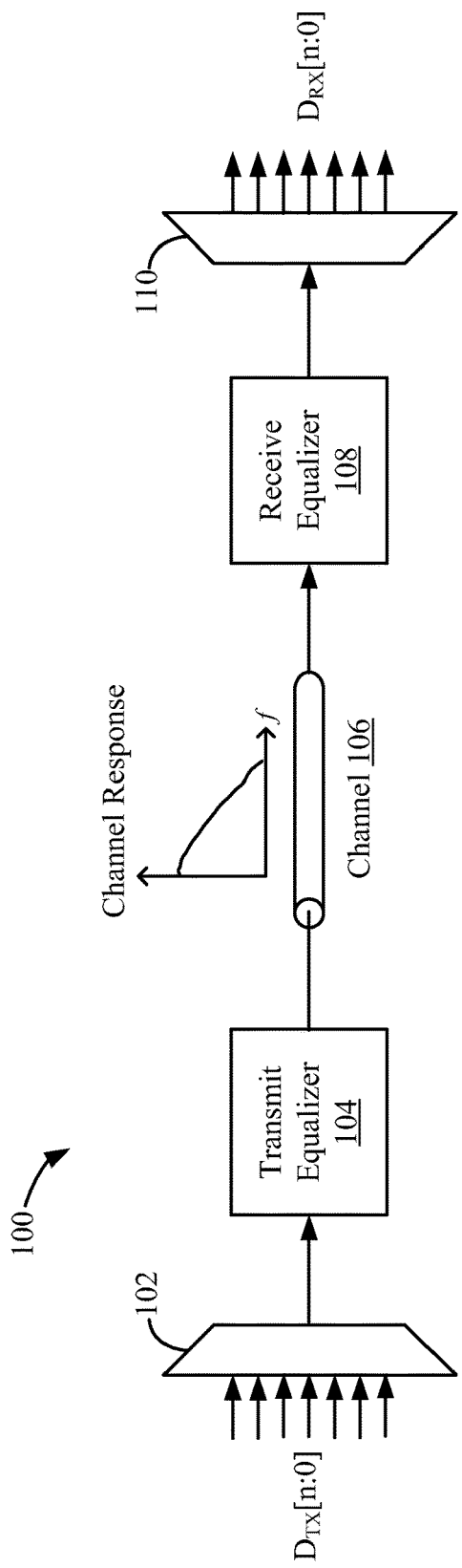
FIG. 1 illustrates a schematic block diagram of a standard serial link communication system found in the prior art.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The word "exemplary" is used herein to mean "serving as an example, instance, or illustration." Any implementation or aspect described herein as "exemplary" is not necessarily to be construed as preferred or advantageous over other aspects of the disclosure. Likewise, an aspect is an implementation or example. Reference in the specification to "an aspect," "one aspect," "some aspects," "various aspects," or "other aspects" means that a particular feature, structure, or characteristic described in connection with the aspects is included in at least some aspects, but not necessarily all aspects, of the present techniques. The various appearances of "an aspect," "one aspect," or "some aspects" are not necessarily all referring to the same aspects. Elements or aspects from an aspect can be combined with elements or aspects of another aspect.

In the following description and claims, the term "coupled" may mean that two or more elements are in direct physical or electrical contact. However, "coupled" may also mean that two or more elements are not in direct contact with each other, but yet still co-operate or interact with each other. In the following description and claims, the term "lower power state" means a state where the device or circuit operating in such a state is consuming less power than it ordinarily would while fully powered and ON. Thus, a lower power state includes states commonly known as "sleep mode" and "low power mode," and also a "power OFF" state.

Not all components, features, structures, characteristics, etc. described and illustrated herein need be included in a particular aspect or aspects. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some aspects have been described in reference to particular implementations, other implementations are possible according to some aspects. Additionally, the arrangement and/or order of circuit elements or other features illustrated in the drawings and/or described herein need not be arranged in the particular way illustrated and described. Many other arrangements are possible according to some aspects.

In each figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

Figure 2:
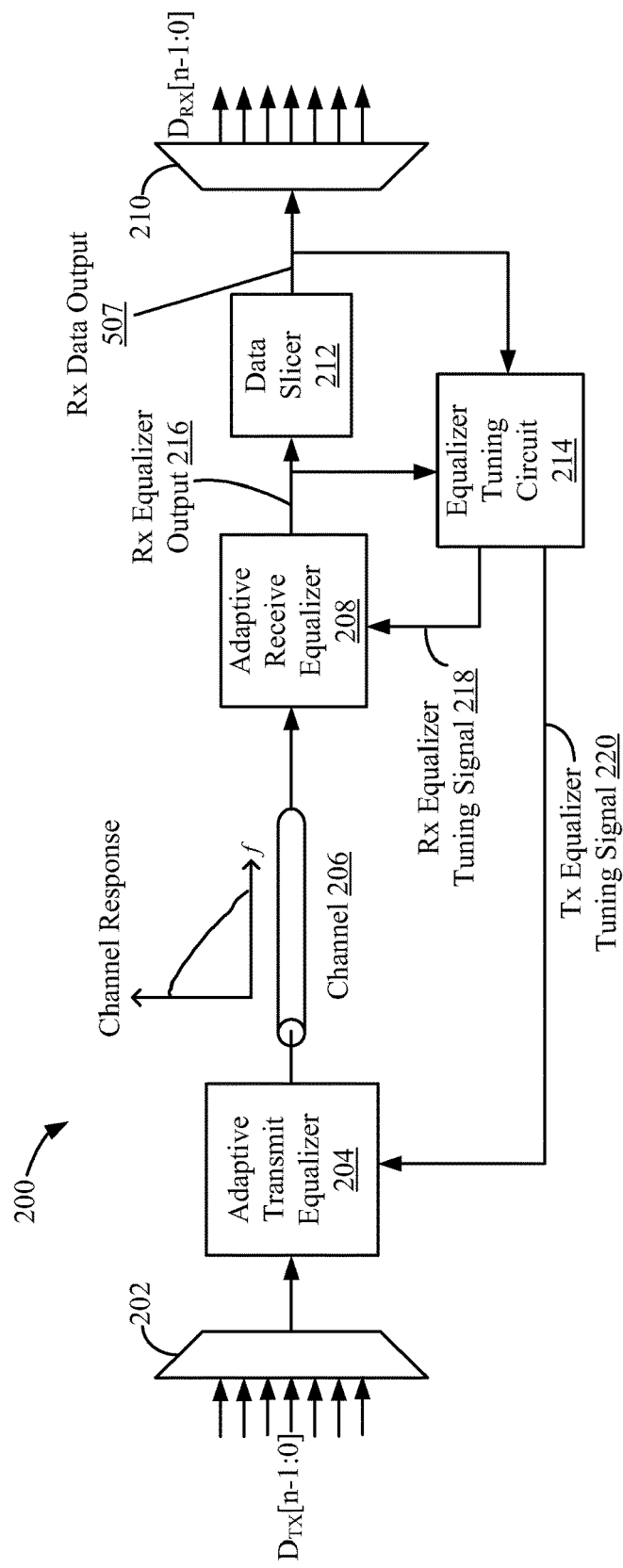
FIG. 2 illustrates a high level block diagram of a high-speed serial link communication system.

FIG. 2 illustrates a high level block diagram of a high-speed serial link communication system 200 according to one aspect. The serial communication system 200 may include a serializer 202, an adaptive transmit equalizer 204, a communication channel 206, an adaptive receive equalizer 208, a deserializer 210, and/or a data slicer 212. In particular, the communication system 200 also includes an equalizer tuning circuit 214.

The serializer 202 converts n-bit parallel data $D_{TX}[n-1:0]$ into a serial stream of data bits in preparation for transmission of the data signal over the lossy communication channel 206 (e.g., conductive wire, air, etc.). Prior to transmission over the communication channel 206, the adaptive transmit equalizer 204 pre-distorts the signal in order to invert the expected distortion of the communication channel 206. Similarly, the adaptive receive equalizer 208 also attempts to invert the expected distortion of the communication channel 206 by attenuating low frequency components and/or boosting high frequency components of the signal. The signal 216 received and output by the adaptive receive equalizer 208 is provided to a data slicer 212, which compares the incoming analog signal to threshold values and outputs a digital data output 507 of the received signal.

The transmit and/or receive equalizers 204, 208 may be adaptive in that their parameters (e.g., equalizer frequency response based on, for example, delay tap coefficient values, number of delay taps, tap delay timing, and/or resonant circuit properties (e.g., resistance, capacitance, inductance (RLC) values)) may be actively tuned based on output performance One non-limiting, non-exclusive example of an adaptive transmit equalizer 204 may be an adaptive finite impulse response (FIR) filter. One non-limiting, non-exclusive example of an adaptive receive equalizer 208 may be an adaptive continuous time linear equalizer (CTLE). These are merely examples and other types of equalizers may be used as transmit and receive equalizers 204, 208.

As described in greater detail below, the equalizer tuning circuit 214 subsamples the receive equalizer's output 216 and generates one or more equalizer tuning signals 218, 220 (e.g., equalizer error correction signals) that may be fed back to the equalizer(s) 204, 208 to tune/adjust equalization parameters. As one non-limiting, non-exclusive example, the adaptive receive equalizer 208 may be a CTLE and the Rx equalizer tuning signal 218 may adjust the resonant circuit properties of the adaptive CTLE by changing its R, L, and C values. As another non-limiting, non-exclusive example, the adaptive transmit equalizer may be an adaptive FIR filter and the Tx equalizer tuning signal 220 may adjust the delay tap coefficient values, number of delay taps, and/or tap delay timing. These changes to the equalizers 204, 208 will change the equalizers' amplitude and frequency response so that the equalized receiver output 507 produces consistent data values for any data pattern (e.g., high frequency data patterns or low frequency data patterns) thereby improving performance of the system (e.g., throughput, bit error rates, ISI, maximize eye opening, etc.). The equalizer tuning circuit 214 utilizes high-speed track and hold circuits to generate the equalizer tuning signals 218, 220. For example, the equalizer tuning circuit 214 may receive the Rx equalizer output signal 216 and determine that additional high frequency gain is needed at the Tx and/or Rx equalizers 204, 208 to correct for the high frequency loss through the channel 206 and improve performance at the receiver data output 507.

Figure 3:
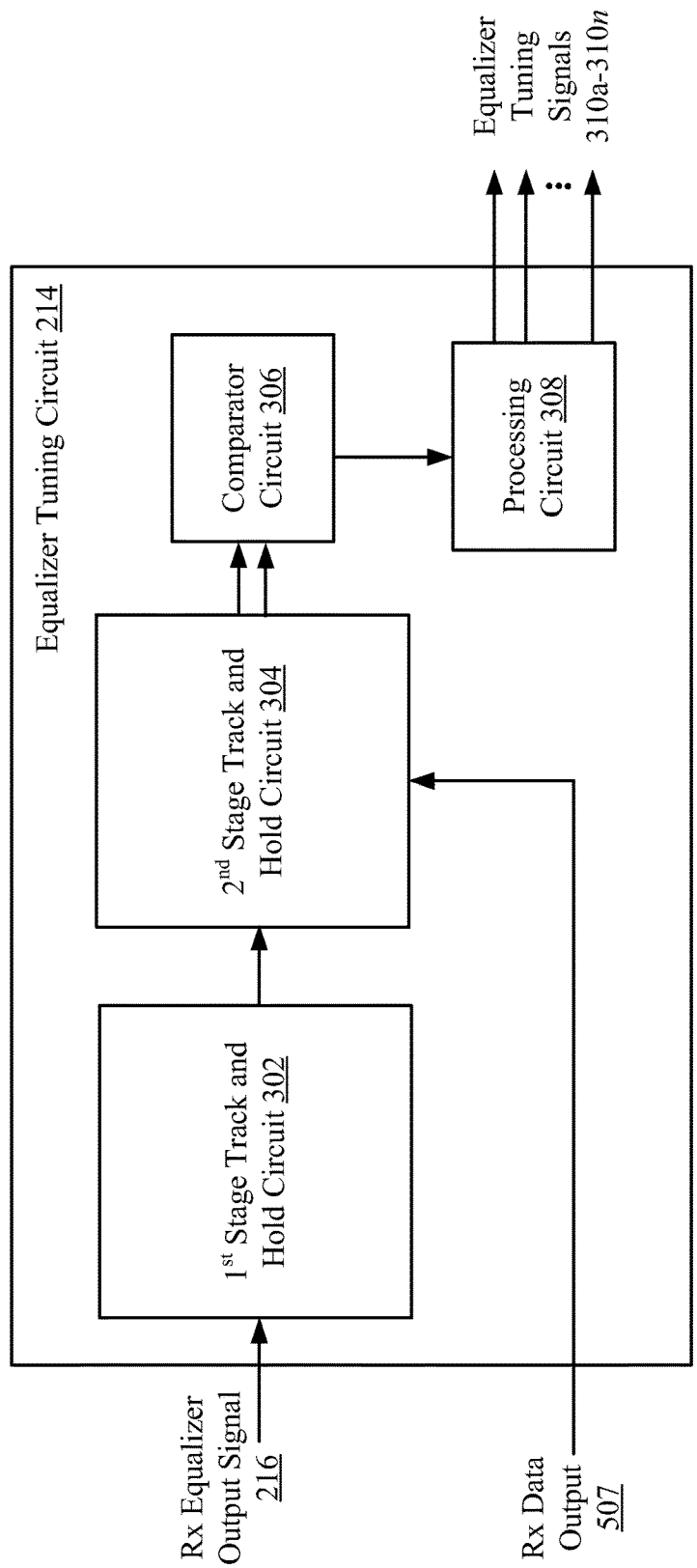
FIG. 3 illustrates a high level block diagram of a first exemplary equalizer tuning circuit.

FIG. 3 illustrates a high level block diagram of the equalizer tuning circuit 214 according to one aspect of the disclosure. The equalizer tuning circuit 214 may include a first stage track and hold circuit 302, a second stage track and hold circuit 304, a comparator circuit 306, and/or a processing circuit 308. The first stage track and hold circuit 302 receives the receive equalizer's output signal 216 and provides its output to the second stage track and hold circuit 304. The second stage track and hold circuit 304 may output, for example, two signal values to the comparator 306 that represent an average of the data values received by the first stage track and hold circuit 302 for different data pattern conditions. The output of the comparator 306 is received and analyzed at the processing circuit 308 in order to generate one or more equalizer tuning signals 310a-310n (e.g., up to n number of signals) that tune the amplitude and frequency response of one or more equalizers 204, 208 (see FIG. 2) of the system. For example, the equalizer tuning signals 310a-310n may include the Rx equalizer tuning signal 218 and the Tx equalizer tuning signal 220. As explained in greater detail below, the second stage track and hold circuit 304 receives the Rx data output 507 and uses it to activate circuitry.

Figure 4:
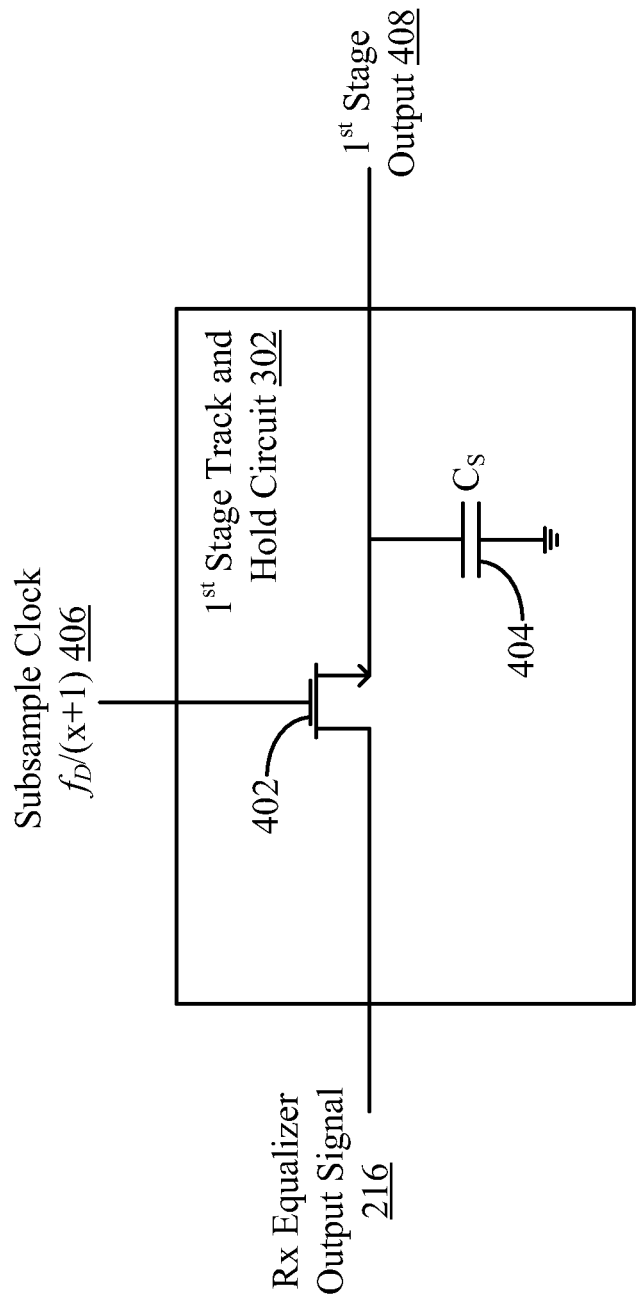
FIG. 4 illustrates a schematic diagram of a first stage track and hold circuit.

FIG. 4 illustrates a schematic diagram of the first track and hold circuit 302 according to one aspect. The first track and hold circuit 302 may include a high-speed metal-oxide-semiconductor field-effect transistor (MOSFET) 402, which acts as a switch, and a capacitor $C_S$ 404. The transistor 402 may be manufactured using any CMOS process and node technology but preferably has relatively low leakage currents when turning OFF. The capacitor $C_S$ 404 may be a MOS capacitor, metal-oxide-metal capacitor, or a metal-insulator-metal capacitor. The transistor 402 receives the Rx equalizer output signal 216 at its drain and its source is coupled to a first terminal of the capacitor $C_S$ 404 (the capacitor's other terminal is grounded). The gate of the transistor 402 is driven by subsample clock 406 having a frequency that is a fraction $1/(x+1)$ of the Rx data rate $f_D$ of the system. The value x refers to the number of bits that pattern detection circuits (discussed in greater detail below) use to detect a pattern match. Preferably the value x is an integer value greater than or equal to three (3). Thus, the subsample clock 406 turns the first stage transistor 402 ON (e.g., track mode) once every x+1 data clock cycles to charge the capacitor $C_S$ 404 to a voltage value of the Rx equalizer output signal 216. The voltage at the capacitor $C_S$ 404 represents the first stage's output signal 408. The equalizer tuning circuit 214, and specifically the first stage track and hold circuit 302, may be one non-limiting, non-exclusive example of a means for subsampling a receive equalizer output of a receive equalizer.

Figure 5:
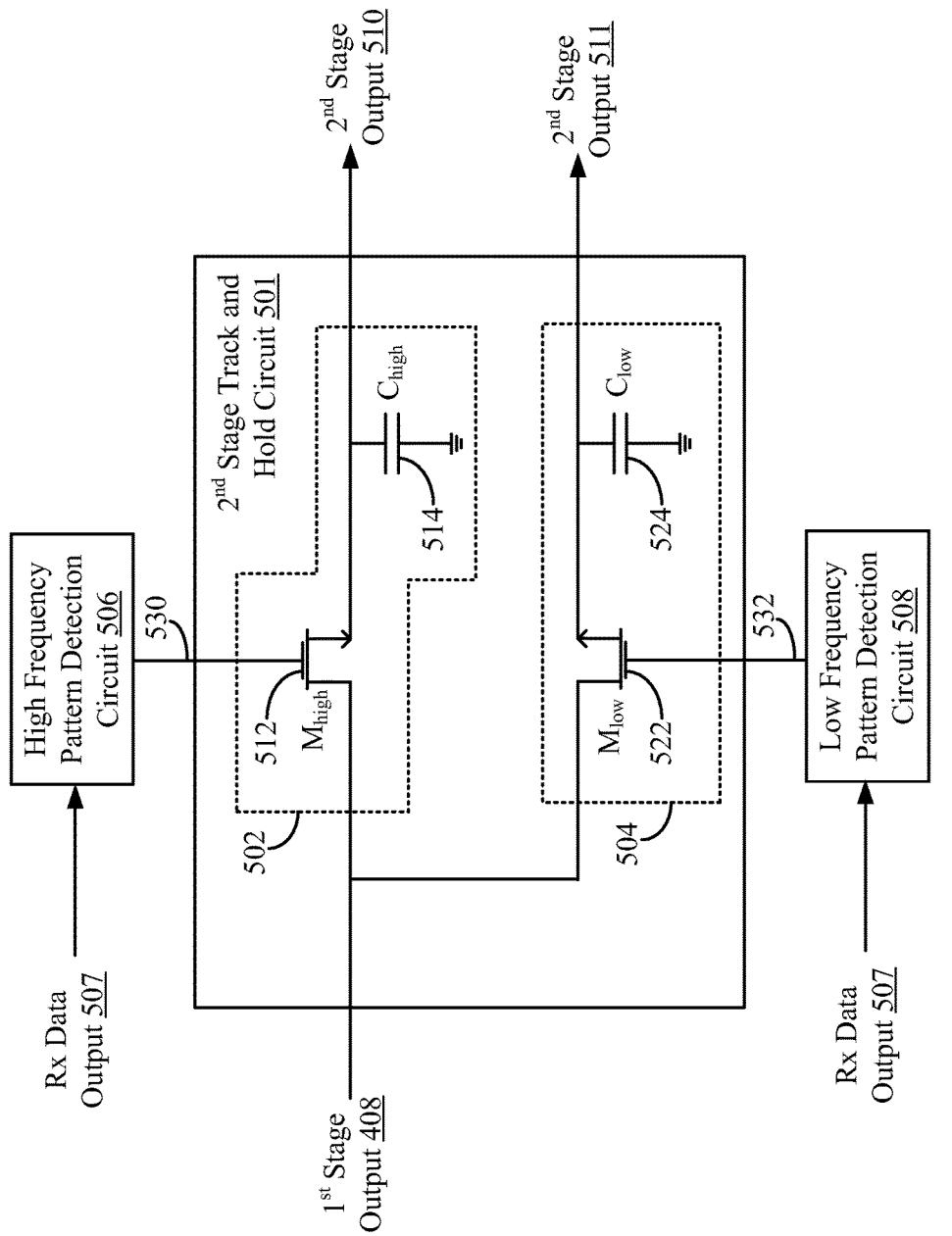
FIG. 5 illustrates a schematic diagram of a second stage track and hold circuit.

FIG. 5 illustrates a schematic diagram of an exemplary second stage track and hold circuit 501 according to one aspect. The second stage track and hold circuit 501 shown in FIG. 5 may be used as the second stage track and hold circuit 304 shown in FIG. 3. Referring to FIG. 5, the second stage tack and hold circuit 501 functions to provide an average (e.g., transient smoothing) of the data values it receives from the first track and hold circuit 302 for different data pattern conditions. According to one example, this averaging function may be performed by the example shown in FIG. 5 that consists of a high frequency path 502 and a low a frequency path 504. The high frequency path 502 includes a MOSFET $M_{high}$ 512, which acts as a switch, and a capacitor $C_{high}$ 514. Similarly, the low frequency path 504 includes a MOSFET $M_{low}$ 522, which also acts as a switch, and a capacitor $C_{low}$ 524. The drains of the two transistors 512, 522 are coupled to the first stage track and hold circuit's output 408. The high frequency path's transistor $M_{high}$ 512 has a gate driven by a high frequency pattern detection circuit 506, while the low frequency path's transistor $M_{low}$ 522 has a gate driven by a low frequency pattern detection circuit 508. Collectively, the high frequency path 502 shown in FIG. 5 effectively serves as a $1^{st}$ order discrete low pass filter to provide an averaging operation of the voltage value seen at the first stage's capacitor $C_S$ 404 during certain data pattern conditions (e.g., high frequency data patterns). Similarly, the low frequency path 504 shown in FIG. 5 effectively serves as a $1^{st}$ order discrete low pass filter to provide an averaging operation of the voltage value seen at the first stage's capacitor $C_S$ 404 during certain data pattern conditions (e.g., low frequency data patterns).

As described in greater detail below, the high frequency pattern detection circuit 506 activates a high frequency track-enable signal 530 that enables (i.e., turns ON) the high frequency path's transistor $M_{high}$ 512 when a high frequency data bit pattern is detected at the Rx data output 507. Similarly, the low frequency pattern detection circuit 508 activates a low frequency track-enable signal 532 that enables (i.e., turns ON) the low frequency path's transistor $M_{low}$ 522 when a low frequency data bit pattern is detected at the Rx data output 507.

The high frequency path's transistor $M_{high}$ 512 has a source coupled to one terminal of the capacitor $C_{high}$ 514 while the other terminal of $C_{high}$ 514 is grounded. Similarly, the low frequency path's transistor $M_{low}$ 522 has a source coupled to one terminal of the capacitor $C_{low}$ 524 while the other terminal of $C_{low}$ 524 is grounded.

In operation when transistor $M_{high}$ 512 is turned ON (e.g., the high frequency path 502 enters tracking mode) capacitor $C_{high}$ 514 becomes coupled to capacitor $C_S$ 404 (see FIG. 4). Assuming $C_{high} \gg C_S$, then the voltage across $C_{high}$ 514 attains a voltage value representative of the average voltage value across $C_S$ 404 when a large number of high frequency patterns are detected. Similarly, when transistor $M_{low}$ 522 is turned ON (e.g., the low frequency path 504 enters tracking mode) capacitor $C_{low}$ 524 becomes coupled to capacitor $C_S$ 404 (see FIG. 4). Assuming $C_{low} \gg C_S$, then the voltage across $C_{low}$ 524 attains a voltage value representative of the average voltage value across $C_S$ 404 when a large number of low frequency patterns are detected. A "large number" in this context may be, for example, at least 10, at least a few tens, at least 100, at least a few hundred, at least a thousand, or more.

The voltage at $C_{high}$ 514 may represent the first output signal 510 of the second stage and the voltage at $C_{low}$ 524 may represent the second output signal 511 of the second stage. That is, the first output signal 510 may be a first signal representative of an average voltage value of a logical value at the receive equalizer output when a high frequency (HF) bit pattern is detected. The second output signal 511 may be a second signal representative of an average voltage value of the logical value at the receive equalizer output when a steady state bit pattern (may also be referred to as a "low frequency bit pattern") is detected. According to one aspect, the capacitors $C_{high}$ 514 and $C_{low}$ 524 each have relatively low leakage so as to not affect the averaging/smoothing operation they effectively perform. Each second stage capacitor 514, 524 may have a capacitance value that is at least 10 times of the capacitance value of the first stage's capacitor $C_S$ 404. In a preferred aspect, however, the second stage capacitors 514, 524 may each have a capacitance value that is at least a few tens to a few hundred times or more of the capacitance value of the first stage's capacitor $C_S$ 404. The equalizer tuning circuit 214, and specifically the second stage track and hold circuit 304, may be one non-limiting, non-exclusive example of a means for generating a first signal representative of an average voltage value of a logical value at the receive equalizer output when a high frequency (HF) bit pattern is detected at the receive equalizer output, and a means for generating a second signal representative of an average voltage value of the logical value at the receive equalizer output when a steady state bit pattern is detected at the receive equalizer output.

Figure 6:
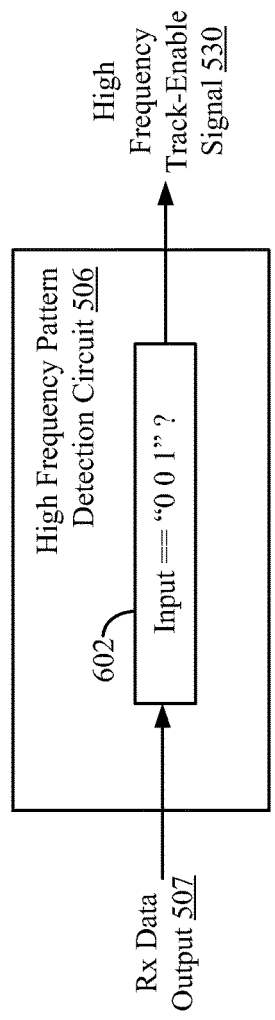
FIG. 6 illustrates a block diagram of a first exemplary high frequency pattern detection circuit.

FIG. 6 illustrates a block diagram of the high frequency pattern detection circuit 506 according to one aspect. The circuit 506 includes logic (e.g., circuits) 602 that detects a preselected, x-bit long data bit pattern that represents a high frequency portion of the received data signal in the time domain. For example, in the illustrated case, the pattern being detected is "0 0 1" (e.g., 3 bits long; x=3). This specific pattern has been preselected to represent a high frequency data transition because generally it can be assumed that by the second repeating bit—here the second "0"—the data signal has adequately settled to the appropriate analog voltage value representative of a logical "0" (e.g., $-V_{DD}$ volts, 0 volts, etc.), and the next data bit transition to a logical "1" requires a high speed transition. Thus, the high frequency pattern detection circuit 506 monitors the incoming received data signal 507 for the data bit pattern "0 0 1" and asserts an enable pulse on the high frequency track-enable signal line 530 once the pattern is detected.

Figure 7:
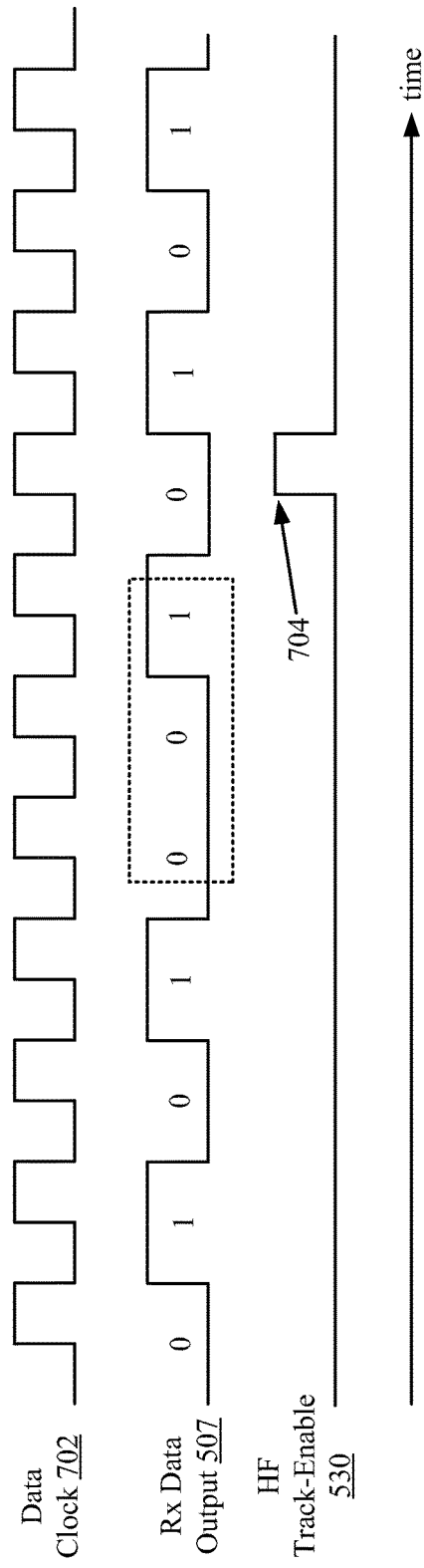
FIG. 7 shows a timing diagram associated with the high frequency pattern detection circuit of FIG. 6.

FIG. 7 shows a timing diagram associated with the high frequency pattern detection circuit 506 of FIG. 6 to illustrate its operation according to one aspect. Referring to FIGS. 6 and 7, data 507 may be received, for example, on the rising edge of the data clock 702 signal. When the high frequency pattern detection circuit 506 detects the data bit pattern "0 0 1" then on the next clock cycle the high frequency pattern detection circuit 506 activates and enables 704 the high frequency track-enable signal 530. In the example shown, the high frequency track-enable signal 530 transitions from a low value to a high value when enabled so that it causes the NMOS transistor $M_{high}$ 512 (see FIG. 5) to turn ON (e.g., enter tracking mode) and provide a low impedance path between the first stage's capacitor $C_S$ 404 (see FIG. 4) and the second stage's high frequency path capacitor $C_{high}$ 514 (see FIG. 5). The example described above with respect to FIGS. 6 and 7 are merely exemplary. In other aspects, other high frequency patterns, such as "1 0 1" may be detected using the same principle of operation.

Figure 8:
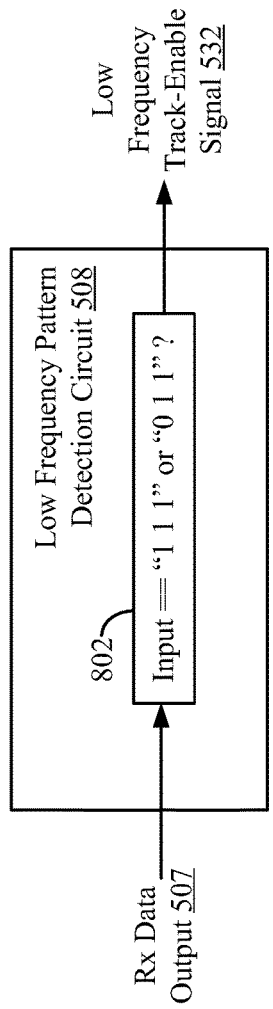
FIG. 8 illustrates a block diagram of a first exemplary low frequency pattern detection circuit.

FIG. 8 illustrates a block diagram of the low frequency pattern detection circuit 508 according to one aspect. The circuit 508 includes logic (e.g., circuits) 802 that detects a preselected, x-bit long data bit pattern that represents a low frequency portion of the received data signal in the time domain. For example, in the illustrated case, the patterns being detected are "1 1 1" and "0 1 1" (e.g., 3 bits long; x=3). These specific patterns have been preselected to represent a low frequency data transition because generally it can be assumed that by the second or third repeating bit—here the second or third "1"—the data signal has adequately settled to the appropriate analog voltage value representative of a logical "1" (e.g., $+V_{DD}$ volts). Thus, the low frequency pattern detection circuit 508 monitors the incoming received data signal 507 for the data bit patterns "1 1 1" and "0 1 1" and asserts an enable pulse on the low frequency track-enable signal line 532 once one of the patterns are detected.

Figure 9:
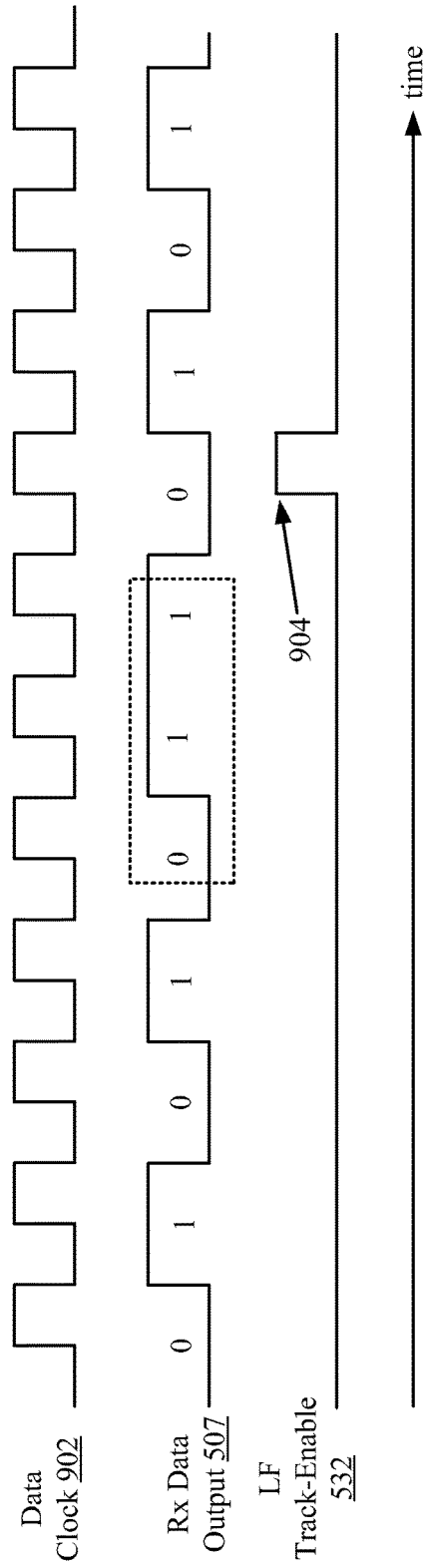
FIG. 9 shows a timing diagram associated with the low frequency pattern detection circuit of FIG. 8.

FIG. 9 shows a timing diagram associated with the low frequency pattern detection circuit 508 of FIG. 8 to illustrate its operation according to one aspect. Referring to FIGS. 8 and 9, data 507 may be received, for example, on the rising edge of the data clock 902 signal. When the low frequency pattern detection circuit 508 detects the data bit pattern "1 1 1" or "0 1 1" then on the next clock cycle the low frequency pattern detection circuit 508 activates and enables 904 the low frequency track-enable signal 532. In the example shown, the low frequency track-enable signal 532 transitions from a low value to a high value when enabled so that it causes the NMOS transistor $M_{low}$ 522 (see FIG. 5) to turn ON (e.g., enter tracking mode) and provide a low impedance path between the first stage's capacitor $C_S$ 404 (see FIG. 4) and the second stage's low frequency path capacitor $C_{low}$ 524 (see FIG. 5).

In the examples shown and described above with respect to FIGS. 6, 7, 8, and 9, the patterns detected ended with a high value (e.g., "1"). Thus, in such a setup the analog voltage value of the logical "1" value is monitored in order to determine whether and by how much the equalizers' frequency responses need to be tuned. However, in other aspects, this may be reversed and patterns may be detected that monitor the analog voltage value representing a logical "0" value. FIGS. 10-13 below illustrate such an example.

Figure 10:
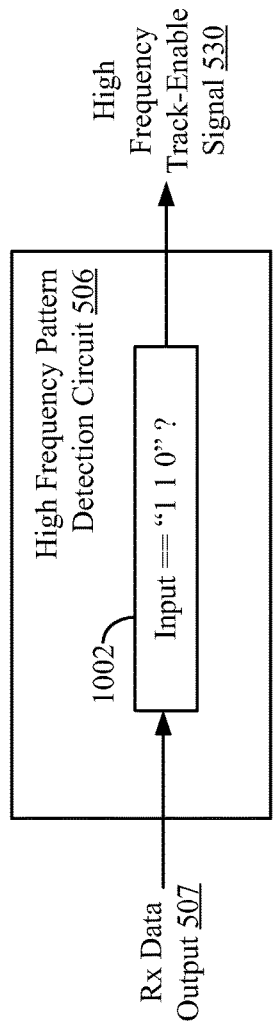
FIG. 10 illustrates a block diagram of a second exemplary high frequency pattern detection circuit.

FIG. 10 illustrates a block diagram of the high frequency pattern detection circuit 506 according to another aspect. The circuit 506 includes logic (e.g., circuits) 1002 that detects a preselected, x-bit long data bit pattern that represents a high frequency portion of the received data signal in the time domain. For example, in the illustrated case, the pattern being detected is "1 1 0" (e.g., 3 bits long; x=3). This specific pattern has been preselected to represent a high frequency data transition because generally it can be assumed that by the second repeating bit—here the second "1"—the data signal has adequately settled to the appropriate analog voltage value representative of a logical "1" (e.g., +$V_{DD}$ volts), and the next data bit transition to a logical "0" requires a high speed transition. Thus, the high frequency pattern detection circuit 506 monitors the incoming received data signal 507 for the data bit pattern "1 1 0" and asserts an enable pulse on the high frequency track-enable signal line 530 once the pattern is detected.

Figure 11:
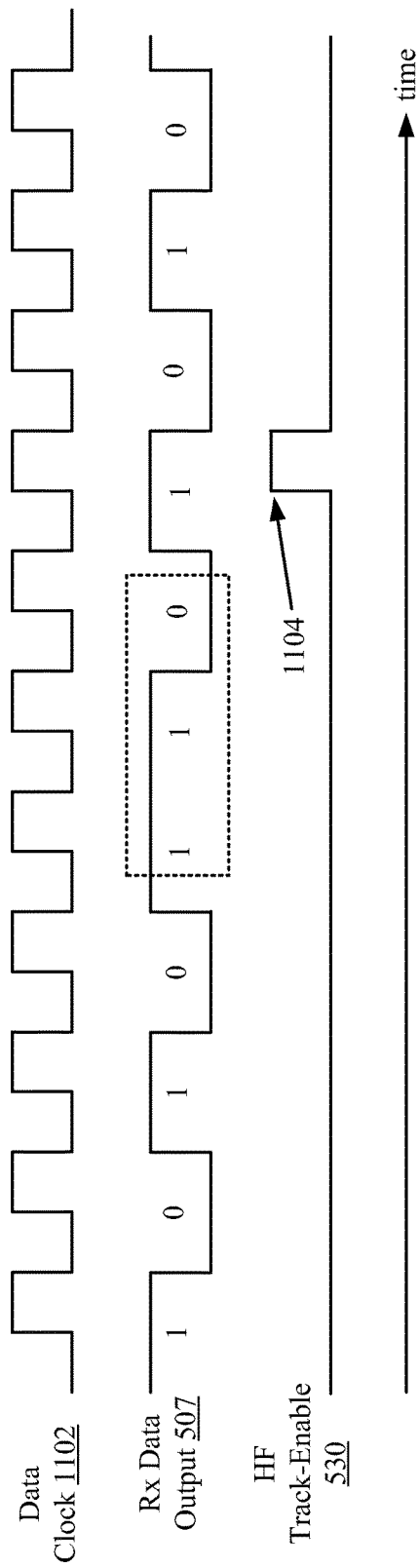
FIG. 11 shows a timing diagram associated with the high frequency pattern detection circuit of FIG. 10.

FIG. 11 shows a timing diagram associated with the high frequency pattern detection circuit 506 of FIG. 10 to illustrate its operation according to one aspect. Referring to FIGS. 10 and 11, data 507 may be received, for example, on the rising edge of the data clock 1102 signal. When the high frequency pattern detection circuit 506 detects the data bit pattern "1 1 0" then on the next clock cycle the high frequency pattern detection circuit 506 activates and enables 1104 the high frequency track-enable signal 530. In the example shown, the high frequency track-enable signal 530 transitions from a low value to a high value when enabled so that it causes the NMOS transistor $M_{high}$ 512 (see FIG. 5) to turn ON (e.g., enter tracking mode) and provide a low impedance path between the first stage's capacitor $C_S$ 404 (see FIG. 4) and the second stage's high frequency path capacitor $C_{high}$ 514 (see FIG. 5). The example described above with respect to FIGS. 10 and 11 are merely exemplary. In other aspects, other high frequency patterns, such as "0 1 0" may be detected using the same principle of operation.

Figure 12:
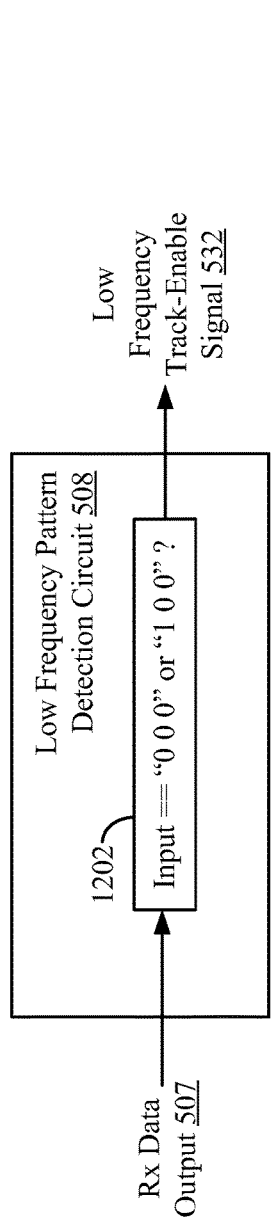
FIG. 12 illustrates a block diagram of a second exemplary low frequency pattern detection circuit.

FIG. 12 illustrates a block diagram of the low frequency pattern detection circuit 508 according to one aspect. The circuit 508 includes logic (e.g., circuits) 1202 that detects a preselected, x-bit long data bit pattern that represents a low frequency portion of the received data signal in the time domain. For example, in the illustrated case, the patterns being detected are "0 0 0" and "1 0 0" (e.g., 3 bits long; x=3). These specific patterns have been preselected to represent a low frequency data transition because generally it can be assumed that by the second or third repeating bit—here the second or third "0"—the data signal has adequately settled to the appropriate analog voltage value representative of a logical "0" (e.g., –$V_{DD}$ volts or 0 volts). Thus, the low frequency pattern detection circuit 508 monitors the incoming received data signal 507 for the data bit patterns "0 0 0" and "1 0 0" and asserts an enable pulse on the low frequency track-enable signal line 532 once one of the patterns are detected.

Figure 13:
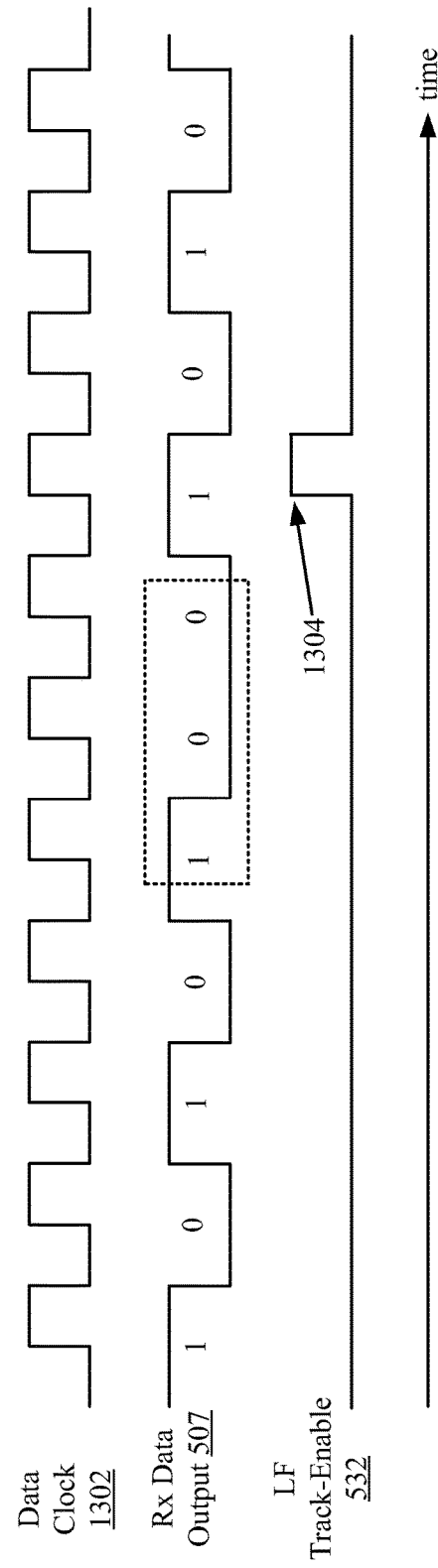
FIG. 13 shows a timing diagram associated with the low frequency pattern detection circuit of FIG. 12.

FIG. 13 shows a timing diagram associated with the low frequency pattern detection circuit 508 of FIG. 12 to illustrate its operation according to one aspect. Referring to FIGS. 12 and 13, data 507 may be received, for example, on the rising edge of the data clock 1302 signal. When the low frequency pattern detection circuit 508 detects the data bit pattern "0 0 0" or "1 0 0" then on the next clock cycle the low frequency pattern detection circuit 508 activates and enables 1304 the low frequency track-enable signal 532. In the example shown, the low frequency track-enable signal 532 transitions from a low value to a high value when enabled so that it causes the NMOS transistor $M_{low}$ 522 (see FIG. 5) to turn ON (e.g., enter tracking mode) and provide a low impedance path between the first stage's capacitor $C_S$ 404 (see FIG. 4) and the second stage's low frequency path capacitor $C_{low}$ 524 (see FIG. 5).

In the examples described above with respect to FIGS. 6-13, three bit data patterns were detected. Of course, longer bit patterns may also be detected, such as 4-bit, 5-bit, k-bit (k>5), etc. to determine high frequency bit patterns or steady state bit patterns using the same principles described above.

Figure 14:
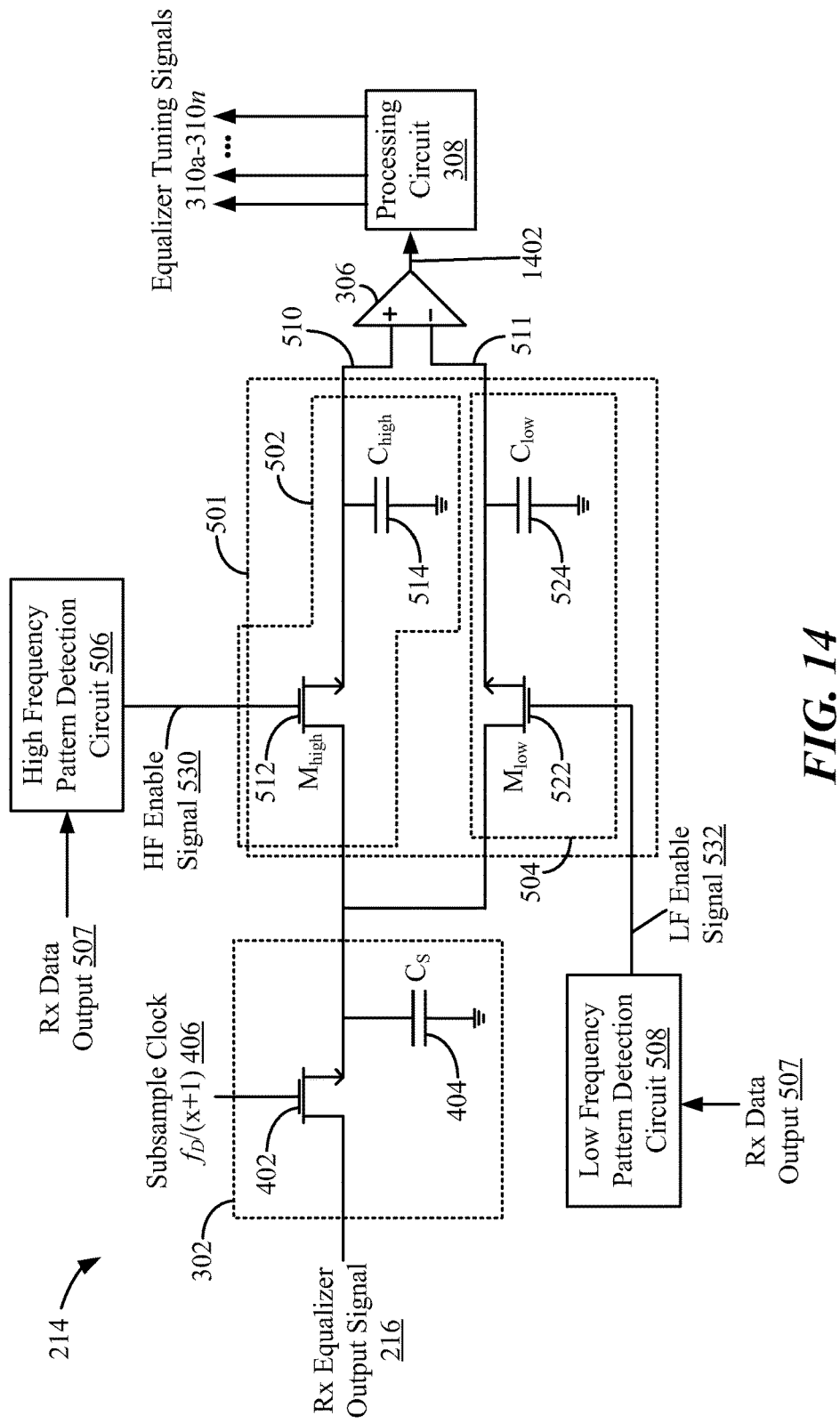
FIG. 14 illustrates a schematic block diagram of a second exemplary equalizer tuning circuit.
Figure 15:
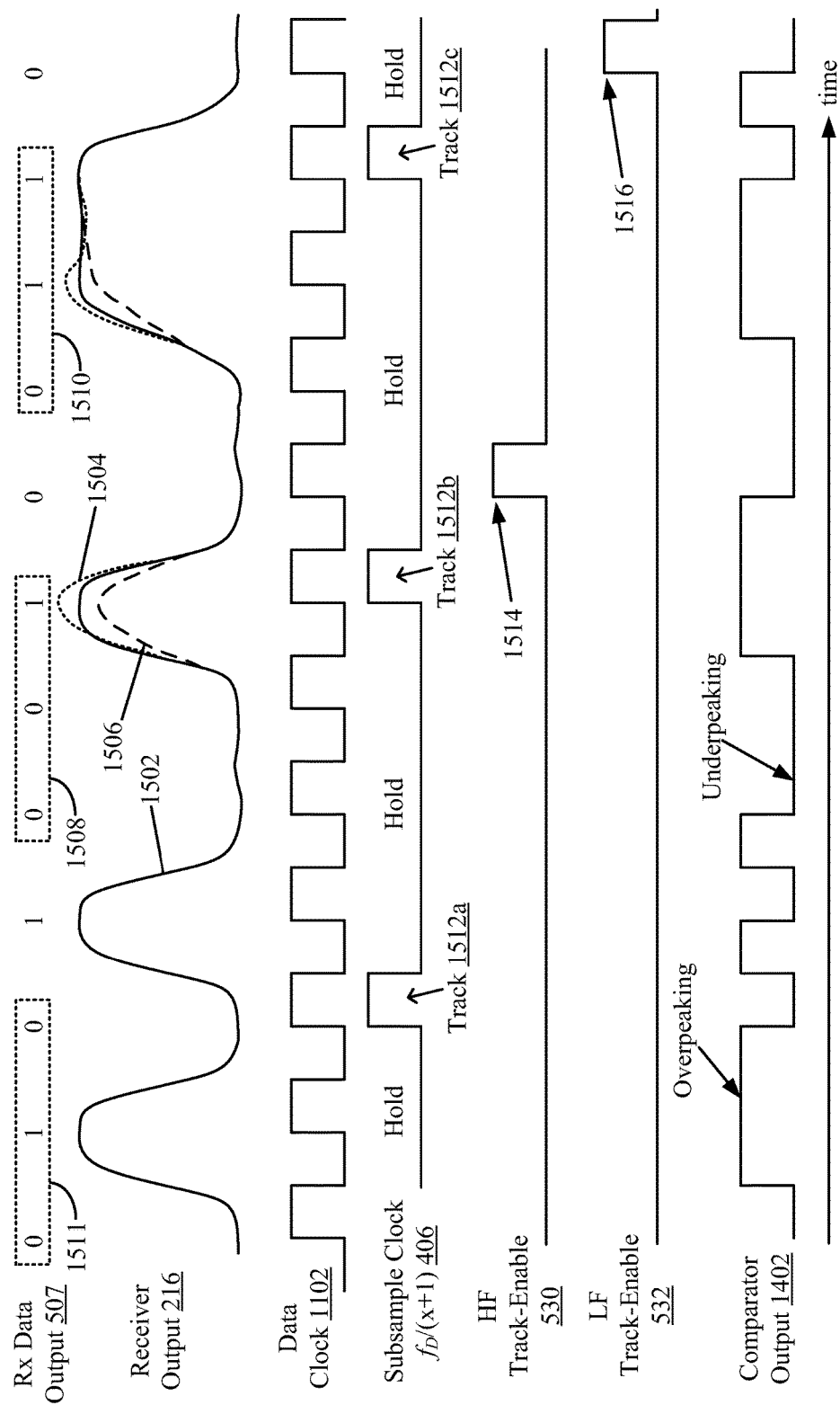
FIG. 15 illustrates a timing diagram associated with the equalizer tuning circuit of FIG. 14.

FIG. 14 illustrates a schematic block diagram of the equalizer tuning circuit 214 according to one aspect. FIG. 15 illustrates a timing diagram associated with the equalizer tuning circuit 214 of FIG. 14 to illustrate its operation according to one aspect. Referring to FIGS. 2, 14, and 15, as one example the system 200 transmits and receives the bit stream "1 0 1 0 0 1 0 0 1 1 0." After the data passes through the system 200 (e.g., through equalizers 204, 208 and channel 206) the receive equalizer output 216 may have one of the waveforms 1502, 1504, 1506 shown in FIG. 15. The solid line 1502 represents the ideal receiver output where logical "1"s all have the same voltage value (e.g., +Vdd) and logical "0"s all have the same voltage value (e.g., –Vdd or ground) irrespective of the bit pattern.

By contrast, the first dashed line 1504 represents a scenario where equalization through the system 200 causes over-peaking of the logical "1" value when the preceding data bit was a logical "0." Typically, this effect is caused by too much high frequency gain at one or more of the equalizers 204, 208. The second dashed line 1506 represents the scenario where equalization through the system 200 causes under-peaking of the logical "1" value when the preceding data bit was a logical "0." Typically this is caused by too little high frequency gain at one or more of the equalizers 204, 208. As described in greater detail below, the equalizer tuning circuit 214 monitors whether the logical "1" value is over-peaking or under-peaking during a high frequency pattern detection state relative to the same logical "1" value during a low frequency/DC state. A high frequency pattern state are those where the bits are transitioning from "0" to "1" or vice versa. A low frequency/DC pattern state is when the bits are holding steady at one logical value such as consecutive "0"s or consecutive "1"s.

In operation the subsample clock 406 that drives the first stage track and hold circuit's transistor 402 runs at a rate that is 1/(x+1) relative to the data rate clock, where x represents the number of bits that the pattern detection circuits 506, 508 use to detect their respective patterns. Thus, the subsample clock 406 has a period that is x+1 times greater than the data rate. In the example shown in FIGS. 14 and 15, the data bit patterns are at most 3 bit patterns (e.g., the longest bit pattern detected is 3 bits) and thus the subsample clock 406 has a period that is 4 times the data rate. In this fashion, the clock 406 used to drive the first stage's transistor 402 between an enable/track and disable/hold state subsamples every fourth data bit of the incoming stream 507.

Meanwhile, the high frequency and low frequency pattern detection circuits 506, 508 monitor the 3 bit words 1508, 1510 that coincide with each first stage track event 1512*a*-1512*c* to see whether they match the specific data bit patterns that each is tasked to recognize. In the example shown, the HF pattern detection circuit 506 is programmed to detect "0 0 1" and the LF pattern detection circuit 508 is programmed to detect "1 1 1" and "0 1 1." Since the incoming data pattern in this example is "1 0 1 0 0 1 0 0 1 1 0," the HF pattern detection circuit 506 detects the "0 0 1" word 1508 that coincides with the second track event 1512*b*, and the LF pattern detection circuit 508 detects the "0 1 1" word 1510 that coincides with the third track event 1512*c*. By contrast, the "0 1 0" word 1511 that coincides with the first track event 1512*a*, however, does not trigger any detection by the pattern detection circuits 506, 508.

Once the HF pattern detection circuit 506 detects the high frequency "0 0 1" word 1508, it activates 1514 the HF track-enable signal 530 causing the second stage's transistor $M_{high}$ 512 to turn ON (e.g., enter tracking mode). Consequently, the high frequency path's capacitor $C_{high}$ 514 electrically couples to the first stage's capacitor $C_S$ 404. Since $C_{high}$ is significantly larger than $C_S$ (e.g., at least an order of magnitude greater in capacitance or more), the voltage value across $C_{high}$ accumulates a running average voltage value of the logical "1" during a high frequency transition state ("0 0 1").

Similarly, when the LF pattern detection circuit 508 detects the low frequency "0 1 1" word 1510, it activates 1516 the LF track-enable signal 532 causing the second stage's transistor $M_{low}$ 522 to turn ON (e.g., enter tracking mode). Consequently, the low frequency path's capacitor $C_{low}$ 524 electrically couples to the first stage's capacitor $C_S$ 404. Since $C_{low}$ 524 is significantly larger than $C_S$ 404 (e.g., at least an order of magnitude greater in capacitance or more), the voltage value across $C_{low}$ 524 accumulates a running average voltage value of the logical "1" during a steady state where the output 216 is not transitioning ("0 1 1" or "1 1 1").

The first output signal 510 and second output signal 511 of the second stage track and hold circuit 501 are input into the comparator circuit 306. According to the example shown in FIG. 14, the voltage value across $C_{high}$ 514, which represents the average receive equalizer output 216 voltage value of a logical "1" during a high frequency data transition (e.g., data stream "0 0 1"), is fed into the comparator circuit 306 along with the voltage value at $C_{low}$ 524, which represents the average receive equalizer output 216 voltage value of a logical "1" during a low frequency/DC data stream (e.g., data stream "1 1 1" or "0 1 1"). According to one aspect, the comparator circuit 306 continuously compares these two voltage values at the capacitors $C_{high}$ 514 and $C_{low}$ 524 and generates a comparator output 1402 high "1" or low "0." According to another aspect, the comparator circuit 306 waits until a sufficient number of sample data values have been averaged into the second stage capacitors $C_{high}$ 514 and $C_{low}$ 524 before the comparator circuit 306 makes a comparison and outputs its high "1" or low "0" value. As one non-limiting, non-exclusive example a sufficient number of sample data values averaged at the second stage capacitors 514, 524 may be M times the ratio of $C_{high}/C_S$ or the ratio $C_{low}/C_S$ where M is at least 2. In a preferred aspect, however, the value M may be a large number such as at least a few tens or larger. As one example if $C_{high}$ 514 and $C_{low}$ 524 each have a capacitance that is 100 times that of $C_S$ 404 and M is 30, then at least 3000 samples may first have to be collected at $C_{high}$ 514 and $C_{low}$ 524 before the comparator circuit 306 produces an output.

According to one example, a comparator output 1402 high "1" value indicates that the voltage at $C_{high}$ 514 has a greater magnitude than that at $C_{low}$ 524 meaning that the average voltage value of the logical "1" during a high frequency data bit transition has a greater magnitude than that of the steady state/DC voltage. Thus, in such a case the receive equalizer output voltage 216 is over-peaking during high frequency data bit transitions compared to the steady state logical "1" value. The high "1" comparator output 1402 value is then provided to a processing circuit 308 which takes the corresponding action necessary to correct this over-peaking. For example, the processing circuit 308 may generate one or more equalizer tuning signals 310a-310n that tune parameters of one or more of the equalizers 204, 208 so as to reduce the high frequency gain, change their amplitude and frequency response, and/or adjust other variables of one or more of the equalizers 204, 208 to reduce over-peaking at the receiver data output 507.

According to another example, the comparator output 1402 low "0" value indicates that the voltage at $C_{high}$ 514 has a magnitude that is less than that at $C_{low}$ 524 meaning that the average voltage value of the logical "1" during a high frequency data bit transition has a magnitude that is less than that of the steady state/DC voltage. Thus, in such a case the receive equalizer output voltage 216 is under-peaking during high frequency data bit transitions compared to the steady state logical "1" value. The low "0" comparator output 1402 value is then provided to the processing circuit 308 which takes the corresponding action necessary to correct this under-peaking. For example, the processing circuit 308 may generate one or more equalizer tuning signals 310a-310n that tune parameters of one or more of the equalizers 204, 208 so as to boost the high frequency gain, change their amplitude and frequency response, and/or adjust other variables of one or more of the equalizers 204, 208 to reduce under-peaking at the receiver data output 507.

According to one aspect, where the comparator circuit 306 continuously compares these two voltage values at the capacitors $C_{high}$ 514 and $C_{low}$ 524 to generate a the comparator output 1402, the processing circuit 308 may wait until a sufficient number of sample data values have been averaged into the second stage capacitors $C_{high}$ 514 and $C_{low}$ 524 before the processing circuit 308 generates its one or more equalizer tuning signals 310a-310n. As one non-limiting, non-exclusive example, a sufficient number of sample data values averaged at the second stage capacitors 514, 524 may be M times the ratio of $C_{high}/C_S$ or the ratio $C_{low}/C_S$ where M is at least 2. In a preferred aspect, however, the value M may be a large number such as at least a few tens or larger. As one example if $C_{high}$ 514 and $C_{low}$ 524 each have a capacitance that is 100 times that of $C_S$ 404 and M is 40, then at least 4000 samples may first have to be collected at $C_{high}$ 514 and $C_{low}$ 524 before the processing circuit 308 generates its one or more equalizer tuning signals 310a-310n. The comparator 306 may be one non-limiting, non-exclusive example of a means for generating a comparator output signal that indicates which of a first signal and a second signal has a greater magnitude. The processing circuit 308 may be one non-limiting, non-exclusive example of a means for generating at least one equalizer tuning signal based on the comparator output signal, and means for adjusting one or more parameters of an equalizer that affects the receive equalizer output using the at least one equalizer tuning signal.

The example shown and described with respect to FIG. 15 illustrates a scenario where the voltage value of the logical "1" is monitored to determine whether there is over-peaking or under-peaking of that value during a high frequency data pattern state relative (e.g., "0 0 1") to a steady state pattern (e.g., "1 1 1" or "0 1 1"). The same principles and concept can be equally applied to a design where the voltage value of the logical "0" is monitored to determine whether there is over-peaking or under-peaking of the logical value "0" during a high frequency data pattern state (e.g., "1 1 0") relative to a steady state pattern (e.g., "0 0 0" or "1 0 0").

The aforementioned equalizer tuning circuit 214 that utilizes two stage track and hold circuitry to determine system performance and generate equalizer tuning signals in real time has a number of advantages. For example, such an architecture provides equalizer tuning with very high accuracy without the need for precision matching between the first stage and second stage MOS transistors 402, 512, 522, nor first stage and second stage capacitor values $C_S$ 404, $C_{high}$ 514, and $C_{low}$ 524. Precision matching for the transistors/switches 402, 512, 514 is not necessary because the MOS transistor/switch mismatch variations mainly impact switch resistance which has little effect on the tracked signal value 216, as long as the resistance is sufficiently small Precision matching for the capacitors 404, 514, 524 is also not necessary since the values chosen primarily impact the averaging/smoothing filtering time constant and not the ultimate average values at $C_{high}$ 514 and $C_{low}$ 524. The equalizer tuning circuit 214 also provides a means for direct signal measurement before the sampler, which can be used for monitoring the analog Rx data eye opening for purposes of other adaptive equalizer tuning, such as finite impulse response or simply for tracking the link quality. Such a system also consumes relative little power and has low silicon overhead since it only comprises a handful of transistors and capacitors.

Figure 16:
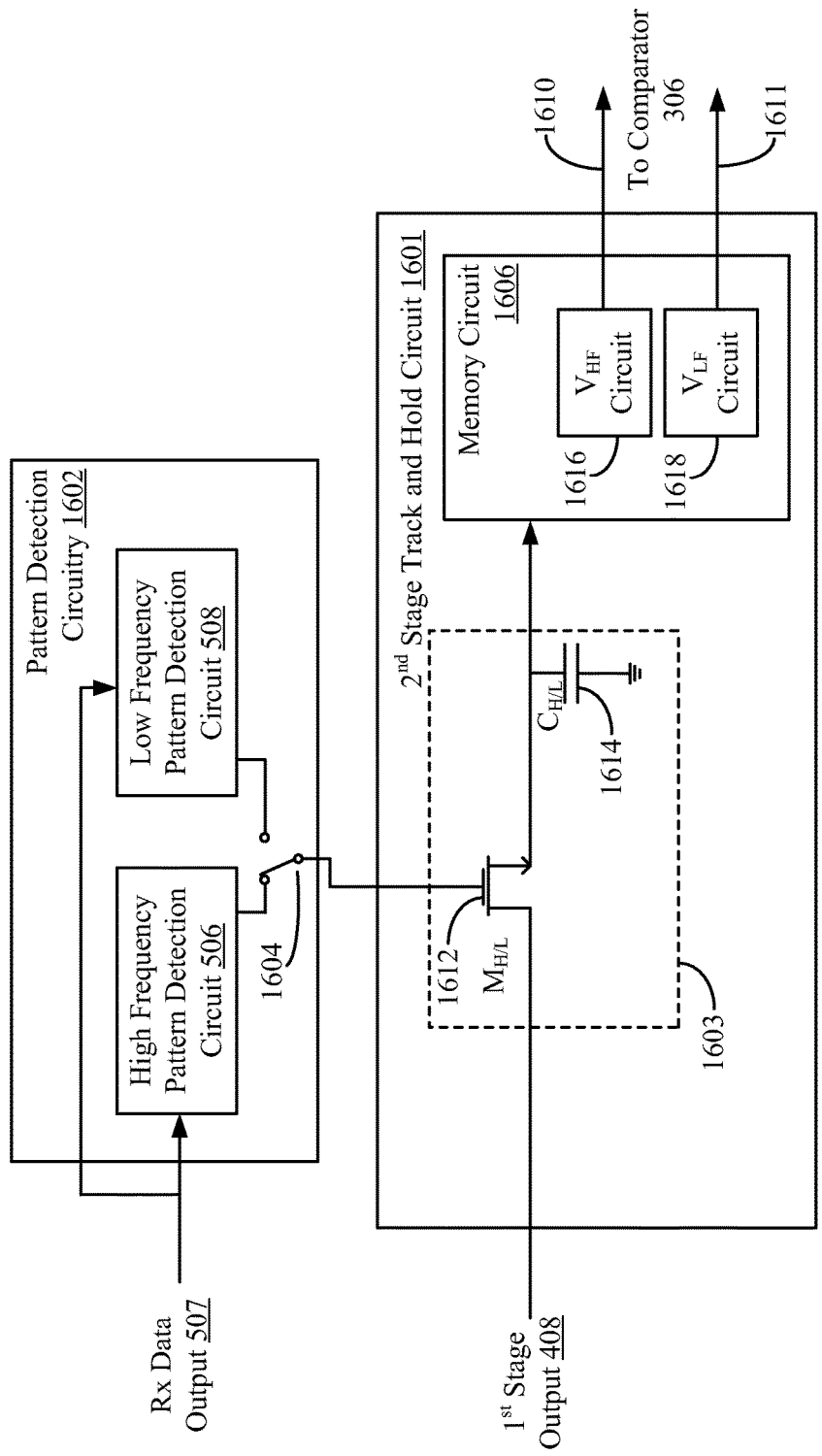
FIG. 16 illustrates a schematic block diagram of a third exemplary equalizer tuning circuit.

FIG. 16 illustrates a schematic diagram of another exemplary second stage track and hold circuit 1601 that may be used as the second stage track and hold circuit 304 shown in FIG. 3. Like the second track and hold circuit 501 shown in FIG. 5, the second stage track and hold circuit 1601 shown in FIG. 16 functions to provide an average (e.g., transient smoothing) of the data values it receives from the first track and hold circuit 302 for different data pattern conditions. The circuit 1601 differs in that it has a single transistor/capacitor path 1603 that is time shared to allow for measuring both high frequency bit pattern and steady state bit pattern logical voltage values. The path 1603 effectively serves as a $1^{st}$ order discrete low pass filter to provide an averaging operation of the voltage value seen at the first stage's capacitor $C_S$ 404 during certain data pattern conditions (e.g., high frequency data pattern or low frequency data patterns).

The second stage track and hold circuit 1601 may include a transistor $M_{H/L}$ 1612, a capacitor $C_{H/L}$ 1614, and a memory circuit 1606. The drain of the transistor 1612 may be coupled to the first stage track and hold circuit's output 408. The transistor 1612 may have a source coupled to one terminal of the capacitor 1614 while the other terminal of the capacitor 1614 may be grounded. The transistor 1612, which acts as a switch, has a gate driven by pattern detection circuitry 1602, which includes the high frequency pattern detection circuit 506 and the low frequency pattern detection circuit 508. (Although the high frequency pattern detection circuit 506 and the low frequency pattern detection circuit 508 are shown as separate circuit blocks in FIGS. 5 and 16, in practice a single circuit may perform the functions of both these circuits 506, 508.) As described below, the voltage values that accumulate across the capacitor 1614 may be stored at the memory circuit 1606.

In operation, the pattern detection circuitry 1602 may be configured such that either the high frequency pattern detection circuit 506 or low frequency pattern detection circuit 508 is active/enabled. In the case where the high frequency pattern detection circuit 506 is active, the high frequency pattern detection circuit 506 drives the second stage track and hold's transistor $M_{H/L}$ 1612. In the case where the low frequency pattern detection circuit 508 is active, the low frequency pattern detection circuit 508 drives the second stage track and hold's transistor $M_{H/L}$ 1612. In FIG. 16, a switch 1604 is illustrated as activating either the high frequency pattern detection circuit 506 or the low frequency pattern detection circuit 508 by coupling it to the transistor's 1612 gate. However, in practice no such switch 1604 may be needed.

If the high frequency pattern detection circuit 506 is active, then a high frequency bit pattern (non-limiting examples including "0 0 1", "1 1 0") causes the high frequency pattern detection circuit 506 to turn ON the transistor $M_{H/L}$ 1612, which couples the second stage capacitor $C_{H/L}$ 1614 to the first stage capacitor $C_S$ 404 (see FIG. 4). Assuming $C_{H/L} \gg C_S$, then the voltage across $C_{H/L}$ 1614 attains a voltage value representative of the average voltage value across $C_S$ 404 when a large number of high frequency patterns are detected. This voltage value may then be stored in analog or digital form at a high frequency signal storage circuit 1616. After a large number of samples have been taken and a reliable, accurate average voltage value of a logical value (e.g., "1" or "0") for high frequency (HF) bit patterns are detected, the low frequency pattern detection circuit 508 may be activated.

If the low frequency pattern detection circuit 508 is active, then a steady state bit pattern (non-limiting examples including "0 1 1", "1 1 1", "0 0 0", "1 0 0") causes the low frequency pattern detection circuit 508 to turn ON the transistor $M_{H/L}$ 1612, which couples the second stage capacitor $C_{H/L}$ 1614 to the first stage capacitor $C_S$ 404 (see FIG. 4). Assuming $C_{H/L} \gg C_S$, then the voltage across $C_{H/L}$ 1614 attains a voltage value representative of the average voltage value across $C_S$ 404 when a large number of low frequency patterns are detected. This voltage value may then be stored in analog or digital form at a low frequency signal storage circuit 1618. After a large number of samples have been taken and a reliable, accurate average voltage value of a logical value (e.g., "1" or "0") for low frequency (LF) bit patterns are detected, the high frequency pattern detection circuit 506 may again be activated. In the context described above with respect to FIG. 16, a "large" number of samples may be, for example, at least 10, at least a few tens, at least 100, at least a few hundred, at least a thousand, or more.

The value stored at the high frequency signal storage circuit 1616 may represent the first output signal 1610 of the second stage and the value stored at the low frequency storage circuit 1618 may represent the second output signal 1611 of the second stage. The first output signal 1610 may be a first signal representative of an average voltage value of a logical value at the receive equalizer output when a high frequency (HF) bit pattern is detected. The second output signal 1611 may be a second signal representative of an average voltage value of the logical value at the receive equalizer output when a steady state bit pattern is detected. Referring to FIGS. 3 and 14, the second stage output values 1610, 1611 are then output to the comparator circuit 306 and operation of the equalizer tuning circuit 214 proceeds in substantially the same fashion to generate equalizer tuning signals 310a-310n.

In one aspect, the storage circuits 1616, 1618 may be analog circuits known in the art to store the values 1610, 1611 in analog form. In other aspects, the storage circuits 1616, 1618 may be digital memory circuits (e.g., DRAM, SRAM, flash, etc.) to store the values 1610, 1611 in digital form. In the latter case, an analog to digital converter may be used to convert the analog value at the capacitor $C_{H/L}$ 1614 to digital form prior to storage.

According to one aspect, the capacitor $C_{H/L}$ 1614 has relatively low leakage so as to not affect the averaging/smoothing operation it effectively performs. The capacitor $C_{H/L}$ 1614 may have a capacitance value that is at least 10 times the capacitance value of the first stage's capacitor $C_S$ 404. In a preferred aspect, however, the second stage capacitor $C_{H/L}$ 1614 may have a capacitance value that is at least a few tens to a few hundred times or more of the capacitance value of the first stage capacitor $C_S$ 404.

Figure 17:
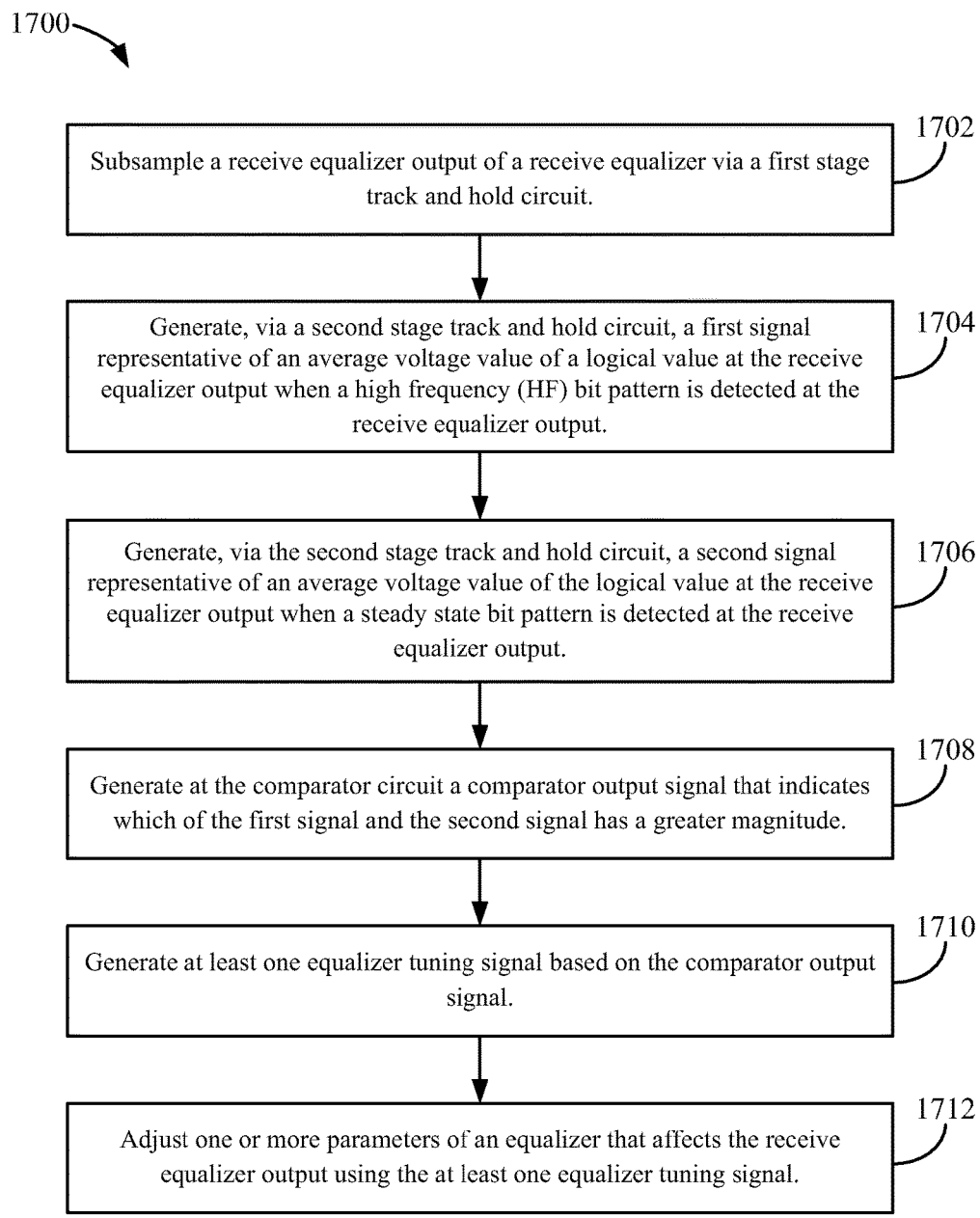
FIG. 17 illustrates a method for providing correction signals to one or more equalizers.

FIG. 17 illustrates a method 1700 for providing correction signals to one or more equalizers. First, a receive equalizer output of a receive equalizer may be subsampled 1702 via a first stage track and hold circuit. Next, a second stage track and hold circuit may generate 1704 a first signal representative of an average voltage value of a logical value at the receive equalizer output when a high frequency (HF) bit pattern is detected (e.g., at the receiver output 507). Then, the second stage track and hold circuit may generate 1706 a second signal representative of an average voltage value of the logical value at the receive equalizer output when a steady state bit pattern is detected (e.g., at the receiver output 507). Next, a comparator output signal may be generated 1708 at the comparator circuit that indicates which of the first signal and the second signal has a greater magnitude. Next, at least one equalizer tuning signal is generated 1710 based on the comparator output signal. Then, one or more parameters of an equalizer that affects the receive equalizer output is adjusted 1712 using the at least one equalizer tuning signal.

According to one aspect, the first signal representative of the average voltage value of the logical value at the receive equalizer output when the HF bit pattern is detected is based on a large number of samples (e.g., at least a few tens, at least one hundred, at least a few hundred or at least a thousand) of the receive equalizer output by the first stage track and hold circuit. According to another aspect, the second signal representative of the average voltage value of the logical value at the receive equalizer output when the steady state bit pattern is detected is based on a large number of samples (e.g., at least few tens, at least one hundred, at least a few hundred or at least a thousand) of the receive equalizer output by the first stage track and hold circuit.

One or more of the components, steps, features, and/or functions illustrated in FIGS. 2, 3, 4, 5, 6, 7, 8, 9, 10, 11, 12, 13, 14, 15, 16, and/or 17 may be rearranged and/or combined into a single component, step, feature or function or embodied in several components, steps, or functions. Additional elements, components, steps, and/or functions may also be added without departing from the invention. The apparatus, devices, and/or components illustrated in FIGS. 2, 3, 4, 5, 6, 8, 10, 12, 14, and/or 16 may be configured to perform one or more of the methods, features, or steps described in FIGS. 7, 9, 11, 13, 15, and/or 17. The algorithms described herein may also be efficiently implemented in software and/or embedded in hardware.

Also, it is noted that the aspects of the present disclosure may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine-readable mediums and, processor-readable mediums, and/or computer-readable mediums for storing information. The terms "machine-readable medium", "computer-readable medium", and/or "processor-readable medium" may include, but are not limited to non-transitory mediums such as portable or fixed storage devices, optical storage devices, and various other mediums capable of storing or containing instruction(s) and/or data. Thus, the various methods described herein may be fully or partially implemented by instructions and/or data that may be stored in a "machine-readable medium", "computer-readable medium", and/or "processor-readable medium" and executed by one or more processors, machines and/or devices.

Furthermore, aspects of the disclosure may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration. As just one example the processing circuit 308 of FIGS. 3 and 14 may be an ASIC that is hard wired to specifically perform one or more of the steps illustrated in FIG. 17.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An apparatus comprising:
   a first stage track and hold circuit configured to subsample a receive equalizer output of a receive equalizer;
   a second stage track and hold circuit coupled to the first stage track and hold circuit, the second stage track and hold circuit configured to generate (a) a first signal representative of an average voltage value of a logical value at the receive equalizer output when a high frequency (HF) bit pattern is detected, and (b) a second signal representative of an average voltage value of the logical value at the receive equalizer output when a steady state bit pattern is detected;
   a comparator circuit configured to generate a comparator output signal that indicates which of the first signal and the second signal has a greater magnitude; and
   a processing circuit that generates at least one equalizer tuning signal based on the comparator output signal, the equalizer tuning signal configured to adjust one or more parameters of an equalizer that affects the receive equalizer output.

2. The apparatus of claim 1, wherein the first stage track and hold circuit comprises a first transistor coupled to a first capacitor.

3. The apparatus of claim 2, wherein the first transistor is a metal-oxide semiconductor field effect transistor (MOSFET) having a drain coupled to the receive equalizer output and a source coupled to a first terminal of the first capacitor, the first capacitor having a second terminal that is grounded, and the first transistor having a gate that is driven by a subsample clock having a period that is x+1 times greater than a period of data at the receive equalizer output, where x is equal to a number of bits of the high frequency bit pattern or a number of bits of the steady state bit pattern.

4. The apparatus of claim 2, wherein the first stage track and hold circuit samples every fourth data bit at the receive equalizer output by enabling the first transistor to an ON state to electrically couple the first capacitor to the receive equalizer output.

5. The apparatus of claim 2, wherein the second stage track and hold circuit comprises an HF path transistor, a low frequency (LF) path transistor, an HF path capacitor, and an LF path capacitor.

6. The apparatus of claim 5, wherein the HF path and LF path transistors have drains that are coupled to a first terminal of the first capacitor, the HF path transistor having a source coupled to a first terminal of the HF path capacitor, the LF path transistor having a source coupled to a first terminal of the LF path capacitor, the HF path capacitor's first terminal providing the first signal representative of the average voltage value of the logical value at the receive equalizer output when the high frequency bit pattern is detected, and the LF path capacitor's first terminal providing the second signal representative of the average voltage value of the logical value at the receive equalizer output when the steady state bit pattern is detected.

7. The apparatus of claim 6, further comprising:
   an HF pattern detection circuit configured to generate an HF track-enable signal when the HF pattern detection circuit detects the HF bit pattern, the HF pattern detection circuit coupled to a gate of the HF path transistor and configured to enable the HF path transistor with the HF track-enable signal; and
   an LF pattern detection circuit configured to generate an LF track-enable signal when the LF pattern detection circuit detects the steady state bit pattern, the LF pattern detection circuit coupled to a gate of the LF path transistor and configured to enable the LF path transistor with the LF track-enable signal,
   wherein enabling the HF path transistor with the HF track-enable signal electrically couples the first terminal of the HF path capacitor to the first terminal of the first capacitor, and enabling the LF path transistor with the LF track-enable signal electrically couples the first terminal of the LF path capacitor to the first terminal of the first capacitor.

8. The apparatus of claim 5, wherein the first signal representative of the average voltage value of the logical value at the receive equalizer output when the HF bit pattern is detected is based on at least X number of samples of the receive equalizer output by the first stage track and hold circuit, where X=M*(Capacitance(HF path capacitor)/Capacitance(first capacitor)), and the second signal representative of the average voltage value of the logical value at the receive equalizer output when the steady state bit pattern is detected is based on at least Y number of samples of the receive equalizer output by the first stage track and hold circuit, where Y=M*(Capacitance(LF path capacitor)/Capacitance(first capacitor)), and M is equal to or greater than ten (10).

9. The apparatus of claim 1, wherein the HF bit pattern is logical values "0 0 1" and the steady state bit pattern is at least one of logical values "1 1 1" and/or "0 1 1".

10. The apparatus of claim 1, wherein the HF bit pattern is logical values "1 1 0" and the steady state bit pattern is at least one of logical values "0 0 0" and/or "1 0 0".

11. The apparatus of claim 1, wherein the first signal is representative of an average voltage value of a logical value "1" at the receive equalizer output when the HF bit pattern is detected and the second signal is representative of an average voltage value of the logical value "1" at the receive equalizer output when the steady state bit pattern is detected.

12. The apparatus of claim 1, wherein the first signal is representative of an average voltage value of a logical value "0" at the receive equalizer output when the HF bit pattern is detected and the second signal is representative of an average voltage value of the logical value "0" at the receive equalizer output when the steady state bit pattern is detected.

13. The apparatus of claim 1, wherein the first signal having a magnitude greater than the second signal indicates that the first signal is over-peaking relative to the second signal and the equalizer tuning signal adjusts the one or more parameters of the equalizer to reduce high frequency gain at the equalizer.

14. The apparatus of claim 1, wherein the second signal having a magnitude greater than the first signal indicates that the first signal is under-peaking relative to the second signal and the equalizer tuning signal adjusts the one or more parameters of the equalizer to boost high frequency gain at the equalizer.

15. The apparatus of claim 1, wherein the at least one equalizer tuning signal includes a receive equalizer tuning signal that changes one or more parameters of the receive equalizer.

16. The apparatus of claim 15, wherein the receive equalizer is an adaptive continuous time linear equalizer and the one or more parameters of the receive equalizer include at least one of a capacitance, resistance, and/or inductance of the adaptive continuous time linear equalizer.

17. The apparatus of claim 1, wherein the at least one equalizer tuning signal includes a transmit equalizer tuning signal that changes one or more parameters of a transmit equalizer, the transmit equalizer configured to transmit a data signal over a lossy channel received by the receive equalizer.

18. The apparatus of claim 2, wherein the second stage track and hold circuit comprises a second transistor, a second capacitor, and a memory circuit, the second transistor coupled to the second capacitor and the second capacitor coupled to the memory circuit.

19. The apparatus of claim 18, wherein the apparatus further comprises:
a pattern detection circuit configured to detect the HF bit pattern and turn the second transistor ON to couple the first transistor to the second transistor and allow the first signal to be generated at the second capacitor and stored at the memory circuit, the pattern detection circuit further configured to detect the steady state bit pattern and turn the second transistor ON to couple the first transistor to the second transistor and allow the second signal to be generated at the second capacitor and stored at the memory circuit, and wherein the comparator circuit receives the first and second signals from the memory circuit to generate the comparator output signal.

20. A method comprising:
subsampling a receive equalizer output of a receive equalizer via a first stage track and hold circuit;
generating, via a second stage track and hold circuit, a first signal representative of an average voltage value of a logical value at the receive equalizer output when a high frequency (HF) bit pattern is detected;
generating, via the second stage track and hold circuit, a second signal representative of an average voltage value of the logical value at the receive equalizer output when a steady state bit pattern is detected;
generating at a comparator circuit a comparator output signal that indicates which of the first signal and the second signal has a greater magnitude;
generating at least one equalizer tuning signal based on the comparator output signal; and
adjusting one or more parameters of an equalizer that affects the receive equalizer output using the at least one equalizer tuning signal.

21. The method of claim 20, wherein the first stage track and hold circuit comprises a first transistor coupled to a first capacitor.

22. The method of claim 21, wherein the first stage track and hold circuit samples every fourth data bit at the receive equalizer output by enabling the first transistor to an ON state to electrically couple the first capacitor to the receive equalizer output.

23. The method of claim 21, wherein the second stage track and hold circuit comprises an HF path transistor, a low frequency (LF) path transistor, an HF path capacitor, and an LF path capacitor.

24. The method of claim 23, wherein the HF path and LF path transistors have drains that are coupled to a first terminal of the first capacitor, the HF path transistor having a source coupled to a first terminal of the HF path capacitor, the LF path transistor having a source coupled to a first terminal of the LF path capacitor, the HF path capacitor's first terminal providing the first signal representative of the average voltage value of the logical value at the receive equalizer output when the high frequency bit pattern is detected, and the LF path capacitor's first terminal providing the second signal representative of the average voltage value of the logical value at the receive equalizer output when the steady state bit pattern is detected.

25. The method of claim 24, further comprising:
generating, via an HF pattern detection circuit, an HF track-enable signal when the HF pattern detection circuit detects the HF bit pattern, the HF pattern detection circuit coupled to a gate of the HF path transistor and configured to enable the HF path transistor with the HF track-enable signal; and
generating, via an LF pattern detection circuit, an LF track-enable signal when the LF pattern detection circuit detects the steady state bit pattern, the LF pattern detection circuit coupled to a gate of the LF path transistor and configured to enable the LF path transistor with the LF track-enable signal,
wherein enabling the HF path transistor with the HF track-enable signal electrically couples the first terminal of the HF path capacitor to the first terminal of the first capacitor, and enabling the LF path transistor with the LF track-enable signal electrically couples the first terminal of the LF path capacitor to the first terminal of the first capacitor.

26. The method of claim 20, wherein the first signal having a magnitude greater than the second signal indicates that the first signal is over-peaking relative to the second signal and the equalizer tuning signal adjusts the one or more parameters of the equalizer to reduce high frequency gain at the equalizer.

27. The method of claim 21, wherein the second stage track and hold circuit comprises a second transistor, a second capacitor, and a memory circuit, the second transistor coupled to the second capacitor and the second capacitor coupled to the memory circuit, and the method further comprising:
detecting the HF bit pattern and turning the second transistor ON to couple the first transistor to the second transistor to allow the first signal to be generated at the second capacitor;
storing a first value representative of the first signal at the memory circuit;
detecting the steady state bit pattern and turning the second transistor ON to couple the first transistor to the second transistor to allow the second signal to be generated at the second capacitor; and
storing a second value representative of the second signal at the memory circuit, wherein the comparator circuit receives the first and second signals from the memory circuit to generate the comparator output signal.

28. The method of claim 20, wherein the at least one equalizer tuning signal includes a transmit equalizer tuning signal that changes one or more parameters of a transmit equalizer, the transmit equalizer configured to transmit a data signal over a lossy channel received by the receive equalizer, and the one or more parameters of the transmit equalizer include at least one of delay tap coefficient values, number of delay taps, and/or tap delay timing.

29. An apparatus comprising:
    means for subsampling a receive equalizer output of a receive equalizer;
    means for generating a first signal representative of an average voltage value of a logical value at the receive equalizer output when a high frequency (HF) bit pattern is detected;
    means for generating a second signal representative of an average voltage value of the logical value at the receive equalizer output when a steady state bit pattern is detected;
    means for generating a comparator output signal that indicates which of the first signal and the second signal has a greater magnitude;
    means for generating at least one equalizer tuning signal based on the comparator output signal; and
    means for adjusting one or more parameters of an equalizer that affects the receive equalizer output using the at least one equalizer tuning signal.

30. A non-transitory computer-readable storage medium having instructions stored thereon, the instructions, which when executed by at least one processor, causes the at least one processor to:
    subsample a receive equalizer output of a receive equalizer via a first stage track and hold circuit;
    generate, via a second stage track and hold circuit, a first signal representative of an average voltage value of a logical value at the receive equalizer output when a high frequency (HF) bit pattern is detected;
    generate, via the second stage track and hold circuit, a second signal representative of an average voltage value of the logical value at the receive equalizer output when a steady state bit pattern is detected;
    generate at a comparator circuit a comparator output signal that indicates which of the first signal and the second signal has a greater magnitude;
    generate at least one equalizer tuning signal based on the comparator output signal; and
    adjust one or more parameters of an equalizer that affects the receive equalizer output using the at least one equalizer tuning signal.

* * * * *